US012244249B1

(12) United States Patent
Lin et al.

(10) Patent No.: US 12,244,249 B1
(45) Date of Patent: Mar. 4, 2025

(54) SYSTEM AND METHOD FOR ADVANCED ELECTRONIC STARTING SWITCH ASSEMBLY FOR SPLIT-PHASE INDUCTION MOTORS FOR DOMESTIC DRYERS

(71) Applicant: Wolong Electric Group Co., Ltd., Zhejiang (CN)

(72) Inventors: Dingsheng Lin, Venetia, PA (US); Zheng Zhang, Saint Joseph, MI (US); Qianjie Ye, Jinan (CN); Hailing Li, Jinan (CN); Jiyi Sun, Jinan (CN); Jie Liu, Jinan (CN); Changping Yang, Shenzhen (CN); Wangyong Liu, Shenzhen (CN); Shudong Zhu, Shenzhen (CN)

(73) Assignee: Wolong Electric Group Co., Ltd., Zhejiang (CN)

( * ) Notice: Subject to any disclaimer, the term of this patent is extended or adjusted under 35 U.S.C. 154(b) by 0 days.

(21) Appl. No.: 18/882,156

(22) Filed: Sep. 11, 2024

(51) Int. Cl.
*H02P 1/42* (2006.01)
*D06F 34/08* (2020.01)
(Continued)

(52) U.S. Cl.
CPC .............. *H02P 1/42* (2013.01); *D06F 34/08* (2020.02); *D06F 34/10* (2020.02); *D06F 34/20* (2020.02);
(Continued)

(58) Field of Classification Search
CPC .......... D06F 34/10; D06F 58/38; D06F 34/08; D06F 58/26; D06F 2105/48;
(Continued)

(56) References Cited

U.S. PATENT DOCUMENTS 5,281,956 A * 1/1994 Bashark .................. H02P 25/04
340/660
5,744,883 A    4/1998 Lewis et al.
(Continued)

FOREIGN PATENT DOCUMENTS

CA         2419984 A1 *  3/2002
WO    WO-0221967 A1 *  3/2002 ............. A45D 20/12

OTHER PUBLICATIONS

Veinott, C.G., Fractional• and Subfractional• Horsepower Electric Motors, McGraw-Hill Book Company, Third Edition, 1970, pp. 66-71 and 144-145.

*Primary Examiner* — Stephen M Gravini
(74) *Attorney, Agent, or Firm* — Warner Norcross + Judd LLP

(57) ABSTRACT

An electronic starting switch assembly and control methods for a dryer having a split-phase induction motor. The assembly comprises a microcontroller unit (MCU) configured to execute a control method that dynamically manages the motor's operation by monitoring the forward magnitude current. The MCU determines a stabilized startup forward magnitude current and calculates a crossover condition, allowing for precise control of the motor's transition to single-phase operation by disconnecting the auxiliary winding and connecting the heater element based on real-time forward magnitude current analysis and processing. The system can also monitor for overload conditions indicative of rotor speed drops and can re-engage the auxiliary winding to maintain motor performance. The assembly includes a housing with a heat-sink for efficient thermal management and environmental protection of electronic components. The disclosed method provides a robust solution for efficient dryer operation by ensuring accurate control of motor startup, running conditions, and overload protection.

22 Claims, 25 Drawing Sheets

(51) Int. Cl.
*D06F 34/10* (2020.01)
*D06F 34/20* (2020.01)
*D06F 58/26* (2006.01)
*D06F 58/38* (2020.01)
*D06F 103/24* (2020.01)
*D06F 103/46* (2020.01)
*D06F 105/28* (2020.01)
*D06F 105/48* (2020.01)
*G01R 31/34* (2020.01)
*H02P 1/02* (2006.01)
*H02P 23/00* (2016.01)
*H02P 23/14* (2006.01)
*H02P 25/062* (2016.01)
*H05K 7/20* (2006.01)

(52) U.S. Cl.
CPC .............. *D06F 58/26* (2013.01); *D06F 58/38* (2020.02); *G01R 31/343* (2013.01); *H02P 1/028* (2013.01); *H02P 23/0004* (2013.01); *H02P 23/14* (2013.01); *H02P 25/062* (2016.02); *H05K 7/209* (2013.01); *D06F 2103/24* (2020.02); *D06F 2103/46* (2020.02); *D06F 2105/28* (2020.02); *D06F 2105/48* (2020.02)

(58) Field of Classification Search
CPC ............. D06F 2105/28; D06F 2103/46; D06F 2103/24; H02P 1/42; H02P 25/063; H02P 23/004; H02P 1/028; H02P 23/14; G01R 31/343; H05K 7/209

USPC ......................................................... 34/520
See application file for complete search history.

(56) References Cited

U.S. PATENT DOCUMENTS

| | | | |
|---|---|---|---|
| 6,449,870 B1 * | 9/2002 | Perez .................... | A45D 20/30 392/374 |
| 7,034,706 B1 * | 4/2006 | Nippes ................. | G01R 31/343 340/635 |
| 7,183,741 B2 | 2/2007 | Melhorn | |
| 8,502,492 B2 * | 8/2013 | Marcoccia ............. | H02P 23/08 318/438 |
| 8,661,706 B2 * | 3/2014 | Bellinger ................ | D06F 58/36 68/12.04 |
| 8,793,899 B2 * | 8/2014 | Kroeger ................. | D06F 58/20 8/158 |
| 9,397,603 B2 * | 7/2016 | Valenti .................... | H02P 25/18 |
| 9,559,619 B2 * | 1/2017 | Peterson ................. | H02P 1/42 |
| 10,236,800 B2 * | 3/2019 | Peterson ............. | H02P 29/0241 |
| 10,619,286 B2 * | 4/2020 | Pesavento ............... | D06F 34/18 |
| 11,414,811 B2 * | 8/2022 | Kim ......................... | H05B 6/10 |
| 11,777,362 B2 * | 10/2023 | Maetani ................ | H02K 11/33 310/90 |
| 12,102,204 B2 * | 10/2024 | Lelieveld ............... | A45D 20/12 |

\* cited by examiner

Airflow direction

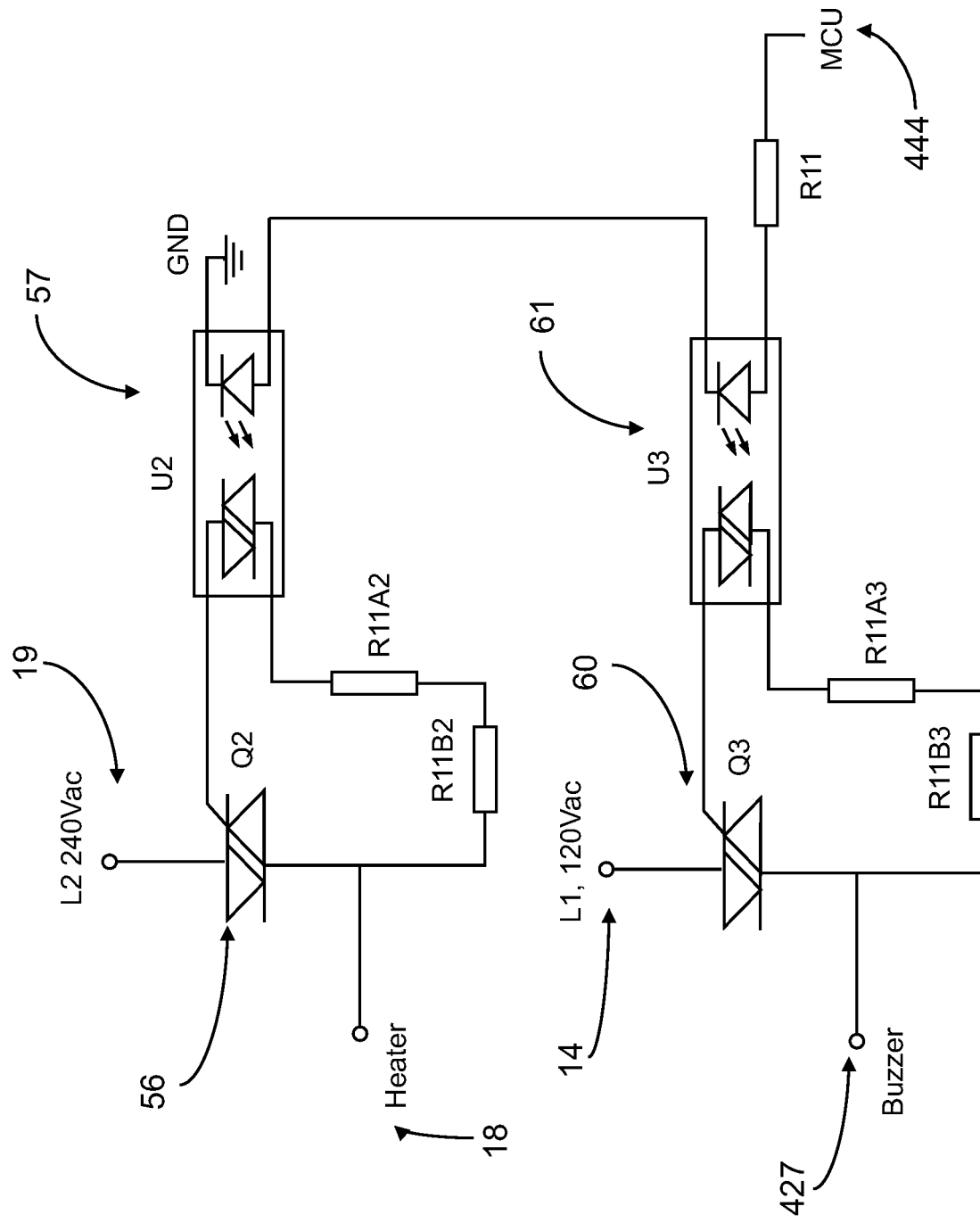

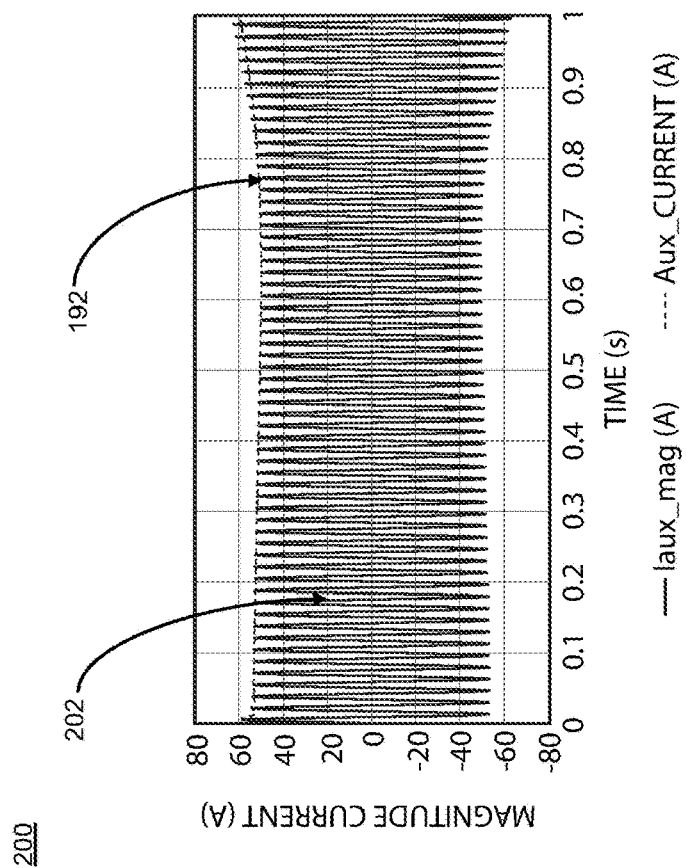
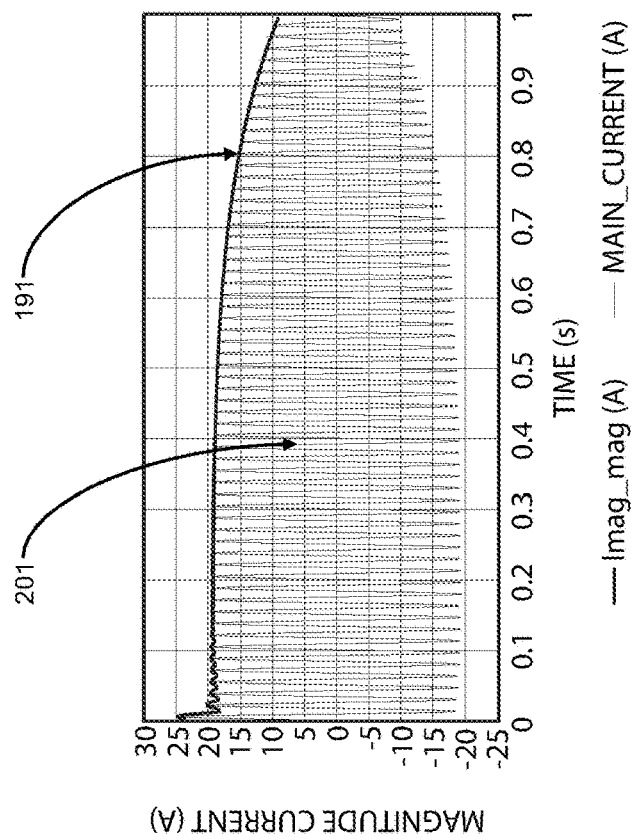
Fig. 16A
Fig. 16B

SYSTEM AND METHOD FOR ADVANCED ELECTRONIC STARTING SWITCH ASSEMBLY FOR SPLIT-PHASE INDUCTION MOTORS FOR DOMESTIC DRYERS

BACKGROUND OF THE INVENTION

The present disclosure relates to operation of an electronic starting switch. For example, as utilized in connection with a split phase induction motor for a domestic dryer or other applications. Certain embodiments relate to an electronic starting switch assembly and control method that is effective to start a split phase induction motor. The electronic starting switch assembly can be used to operate a domestic dryer including turning on a heater above a specific dryer motor speed and turning the heater off whenever the speed drops below a specific speed. These embodiments can replace a legacy mechanical centrifugal switch, which is used in many conventional split phase induction motor applications.

The split phase induction motor has dominated domestic dryer applications for a few decades. To operate a domestic dryer that is paired with a washing machine in a laundry room, a mechanical centrifugal starting switch assembly plays a crucial role. The centrifugal starting switch can effectively start the split phase induction motor after a specific rotor speed is reached. It can effectively turn on the dryer heater when the dryer motor is above a specific rotor speed and then turn-off the heater below that speed, which provides safety and security to heat up the dryer load and protect the dryer load from overheating and damaging the garments. In general, whenever the motor speed is lower than a certain speed, the drum rotates more slowly and airflow decreases through the dryer load inside the drum, resulting in potential overheating issues if the heater is not turned off simultaneously.

A split phase motor is a single-phase induction motor that has a main, or running winding and an auxiliary, or starting winding; the two windings are mutually displaced by 90 electrical degrees. The auxiliary winding has a higher ratio of stator resistance to inductance than that of the main winding, to achieve a phase-splitting effect. As is well known, at standstill status, if only main winding is powered, there is zero torque production. Thus, to start the rotor, both windings are powered to develop torque. Then, after the rotor reaches speed, generally at approximately 75 to 80 percent of synchronous speed, the main winding alone can generate nearly as much torque as the combined windings so the auxiliary winding can be disconnected. Furthermore, at higher speed, between 80 to 90 percent of synchronous, the motor with both windings being powered generates less torque. Consequently, from the torque production point of view, it is advantageous to cut the auxiliary winding out at a "crossover" point, generally at around 75 to 80 percent of synchronous speed. Another reason to disconnect the auxiliary winding is to prevent the motor from drawing excessive wattage, which can risk burning up or damaging the starting winding or other components if the auxiliary winding is left in the circuit too long.

In addition, the functional accuracy and effectiveness of the centrifugal starting switch are even more crucial to the capacitor start motors that are popular in many applications to boost the starting torque capacity. Above the start switch crossover point speed, the capacitor voltage increases rapidly, if the motor comes up to the speed and operates for an appreciable length of time, the capacitor could fail or otherwise malfunction.

A starting switch is generally tasked with turning off the auxiliary winding at the crossover point speed for split phase induction motors as well as capacitor starting induction motors. While the conventional mechanical centrifugal starting switch provides a decently effective solution at relatively low cost for split phase induction motors and capacitor starting motors for home appliances and fractional power applications for decades, there are some problematic issues associated with using a centrifugal starting switch. The mechanical starting switch includes a relay assembly to turn-on and off an inductive load. This can generate sparking. This can be especially problematic for dryer heater operation where there is potential exposure to natural gas or propane leaks, such as in a basement. Further, the sparking effect on the switch contacts may also cause the mechanical starting switch to fail. In addition, from the production point of view, the mechanical switch assembly can add difficulty in manufacturing process controls, such as the accuracy controls of weight assembly and multiple steps of adjustments, which can slow down the production, resulting in higher costs.

While less common, some split phase induction motors utilize an electronic starting switch instead of a centrifugal starting switch. However, electronic starting switches face challenges in terms of reliability and cost effectiveness. The previous arts of electronic starting switches, such as used in connection with water pumps, provide only limited solutions to split phase induction motors for fractional power, where the load is more predictable and fixed. Due to this predictability, previous electronic starting switches use timing controls to activate the starting switch at a starting crossover point speed. However, in many applications, such as domestic dryers, the load (e.g., garment load) is highly variable, therefore this is not effective. In general, the larger the load, the longer the starting time that is needed. Essentially, timing-based control is not a reliable solution for applications where the load is variable. A more reliable and cost effective electronic starting switch assembly including advanced control methodology to achieve efficient and accurate operation of domestic dryers and other applications, is desirable.

SUMMARY OF THE INVENTION

The electronic starting switch assembly disclosed herein comprises a microcontroller unit (MCU), memory, sensing circuitry, and electronic power switch assembly. The MCU is configured to execute a control method that senses and analysis the main and auxiliary winding currents to determine a stabilized startup forward magnitude current. Based on this current, the MCU calculates and stores a crossover condition in memory, which is used to control the electronic power switch assembly to control disconnection of the auxiliary winding and the connection of the heater element when the crossover condition is met.

During operation, the MCU monitors the motor's performance, calculating forward magnitude currents and detecting potential overload condition that can cause the rotor speed to drop below a predetermined threshold. In response to detecting an overload condition, the system can re-engage the auxiliary winding to restore optimal motor performance.

The disclosure also includes an electronic power switch assembly housing that supports a printed circuit board (PCB) and incorporates a heat-sink designed to align with the motor's airflow for improved heat dissipation. The housing is further designed to protect the electronic components from environmental damage, ensuring the longevity and reliability of the assembly.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

BRIEF DESCRIPTION OF THE DRAWINGS

FIG. 6B illustrates an exemplary driving and power switch circuit to turn-on/off a dryer heater and buzzer.

FIG. 16A illustrates exemplary FEA simulation results showing the main phase magnitude current curve as the envelope of the main winding current waveform at speeds ranging from 0 to 1,800 RPM over the first second of starting time.

FIG. 16B illustrates exemplary FEA simulation results showing the auxiliary winding phase magnitude current curve as the envelope of the auxiliary winding current waveform at speeds ranging from 0 to 1,800 RPM over the first second of starting time.

DESCRIPTION OF THE CURRENT EMBODIMENTS

I. Dryer Split-Phase Induction Motor

Figure 1:
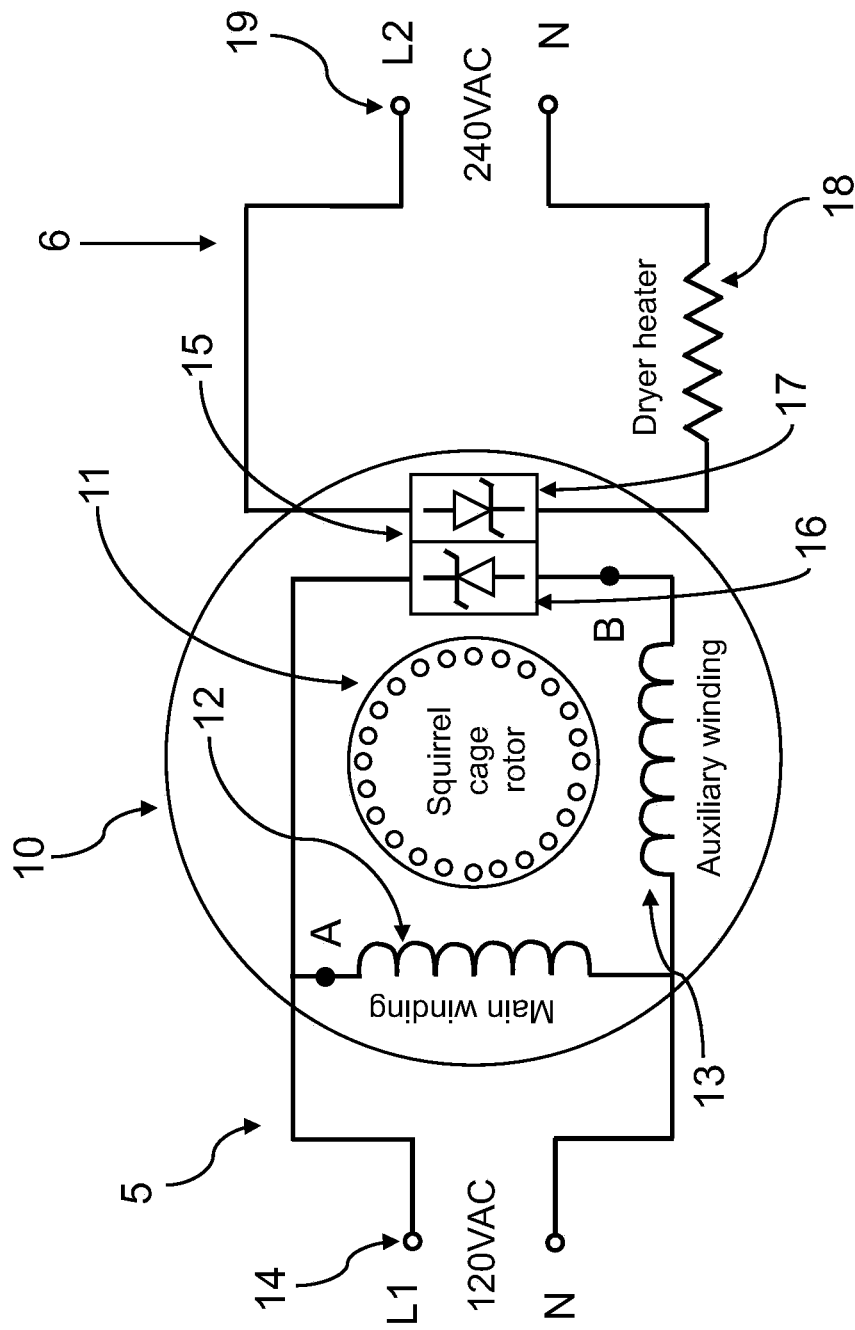
FIG. 1 illustrates a split-phase induction motor diagram for a domestic dryer application showing an electronic starting switch assembly that includes an electronic starting switch for a domestic dryer motor and a coupled dryer heater switch.

FIG. 1 illustrates a split-phase induction motor 10 diagram for a domestic dryer having an electronic starting switch assembly 15 in accordance with the present disclosure. This exemplary split-phase induction motor 10 includes a rotor 11 (e.g., squirrel cage rotor), a main or running winding 12, and an auxiliary or starting winding 13. The auxiliary winding 13 has a higher ratio of stator resistance to inductance than that of the main winding 12 to achieve a phase-splitting effect. When both windings are connected to voltage L1, e.g., 120V AC 14, an elliptic rotating magnetic field is generated in the air gap to start the motor. In response to the rotor speed reaching about 75 to 80 percent of synchronous speed, the microcontroller in the electronic starting switch assembly 15 disconnects the auxiliary winding 13 from voltage L1. This results in torque being generated solely by the main winding 12 magnetic field, driving the rotor to the rated speed.

In the current embodiments, the electronic starting switch assembly 15 includes two electronic power switches 16, 17. The auxiliary winding electronic power switch 16 is configured to selectively connect or disconnect the auxiliary winding 13 to its voltage source L1, effectively allowing the auxiliary winding 13 to be selectively included or excluded from the split-phase induction motor stator circuit 5. The dryer heater electronic power switch 17 is configured to selectively connect or disconnect the dryer heater to its voltage source L2, effectively turning the dryer heater on or off.

In response to the electronic starting switch assembly 15 sensing that the rotor 11 has reached the crossover speed, the auxiliary winding electronic power switch 16 disconnects the auxiliary winding 13 from the split-phase motor stator circuit 5. In addition, for domestic laundry dryer operation, when the motor 10 reaches or exceeds the crossover speed threshold, the electronic starting switch assembly 15 has another electronic power switch 17 that turns on the dryer heater 18 by connecting the dryer heater to the L2 voltage source 19 of the dryer heater circuit 6. If and when the rotor 11 speed drops below the crossover speed, the dryer heater electronic power switch 17 disconnects the dryer heater 18 from the L2 voltage source 19, typically 240V AC.

The electronic starting switch assembly 15, including both the auxiliary winding electronic power switch 16 and the dryer heater electronic power switch 17, can be controlled by a microcontroller. The microcontroller can be included in the electronic starting switch assembly 15 and can control operation of one or both of the electronic power switches 16, 17 based on suitable criteria, e.g., comparison between a crossover speed point stored in memory and sensor feedback. The heater turn-on/off time can be controllable based on the dryer operational requirements, which provides a control feature that conventional centrifugal switches cannot mimic. Point A on the main winding 12 and point B on the auxiliary winding 13 in FIG. 1 show suitable measurement points for signal sensing purposes.

Further exemplary details regarding technical aspects of an electronic starting switch assembly 15 in accordance with the present disclosure for use with a split-phase induction motor to operate a domestic laundry dryer are laid out below.

In response to initial power supply, the electronic starting switch assembly 15 connects both the main winding 12 and the auxiliary winding 13 into the power source 14 L1, normally that is the voltage 120V AC and this causes sufficient torque to cause the motor to rotate.

The microcontroller of the electronic starting switch module 15 can monitor the rotor speed by monitoring the current and/or voltage across the windings 12, 16. In response to the rotor 11 speed reaching a certain threshold stored in memory (e.g., 75 to 80 percent of synchronous speed), the microcontroller of the electronic starting switch assembly 15 can electrically communicate with the electronic power switch 16 to disconnect the auxiliary winding 13 from the L1 voltage source 14, 120V AC. Also, in response to the rotor 11 speed reaching that threshold (or a different threshold stored in memory), the microcontroller of the electronic starting switch assembly 15 can electrically communicate with the electronic power switch 17 to connect the dryer heater 18 into the L2 high voltage power source 19, 240V AC.

The dryer load held inside the dryer drum of domestic dryers are highly variable in scope from a relatively light load, e.g., less than one pound, up to a relatively heavy load, e.g., over 32 lbs. The starting period from zero to the crossover point speed varies largely depending on the load size. This means that a preset static timing for switching in and out the auxiliary winding is generally ineffective. Instead, the present disclosure utilizes the electronic starting switch assembly to switch the auxiliary winding 13 out of the circuit based on the sensed speed of the rotor, which accounts for the variable load unlike a timing-based approach. The dryer heater 18 can also be switched on using the same rotor speed crossover point.

After the rotor speed reaches or passes the crossover point speed, because the dryer load is tumbling inside the drum, any unexpected load variation, such as a piece of wet cotton sheet absorbing a certain amount of water, can generate extra torque load that pulls the rotor speed back to below the crossover point speed momently. In this case, the microcontroller of the electronic starting switch assembly 15 can sense this dip in rotor speed and command the auxiliary winding electronic power switch 16 to reconnect the auxiliary winding back into the circuit to boost the torque again so that the rotor 11 will again increase in speed and pass over the crossover speed point. In this way, the microcontroller in the electronic starting switch assembly 15 not only detects the speed of the rotor passing over the crossover point, but also can be configured to monitor and detects the rotor speed falling below the crossover point, even after the auxiliary winding has been disconnected by the electronic power switch 16 from the 120V AC circuit. The other electronic power switch 17 that controls the dryer heater 18 can take corresponding action, e.g., the microcontroller can also command the dryer heater electronic switch 17 to disconnect the dryer heater from the voltage source turning it off when the rotor speed falls below the crossover point. This functionality that is provided by the electronic starting switch assembly 15 of the present disclosure to operate domestic or household laundry dryers is essentially impossible for a conventional mechanical starting switch to provide. However, because the electronic starting switch assembly 15 can be programmed to respond to rotor speed sensor information and does not operate based on timing triggers, it can effectively respond to variations in rotor speed over time. The electronic power switch components 16, 17 can selectively connect and disconnect the auxiliary winding and dryer heater based on pre-programmed instructions that trigger off rotor speed sensor information.

Consequently, any starting methods configured to operate based solely on a one-time timing delay, meaning they only disconnect the auxiliary winding once are not practical for domestic laundry dryer applications.

II. Electronic Switch Assembly and Installation

Figure 2A:
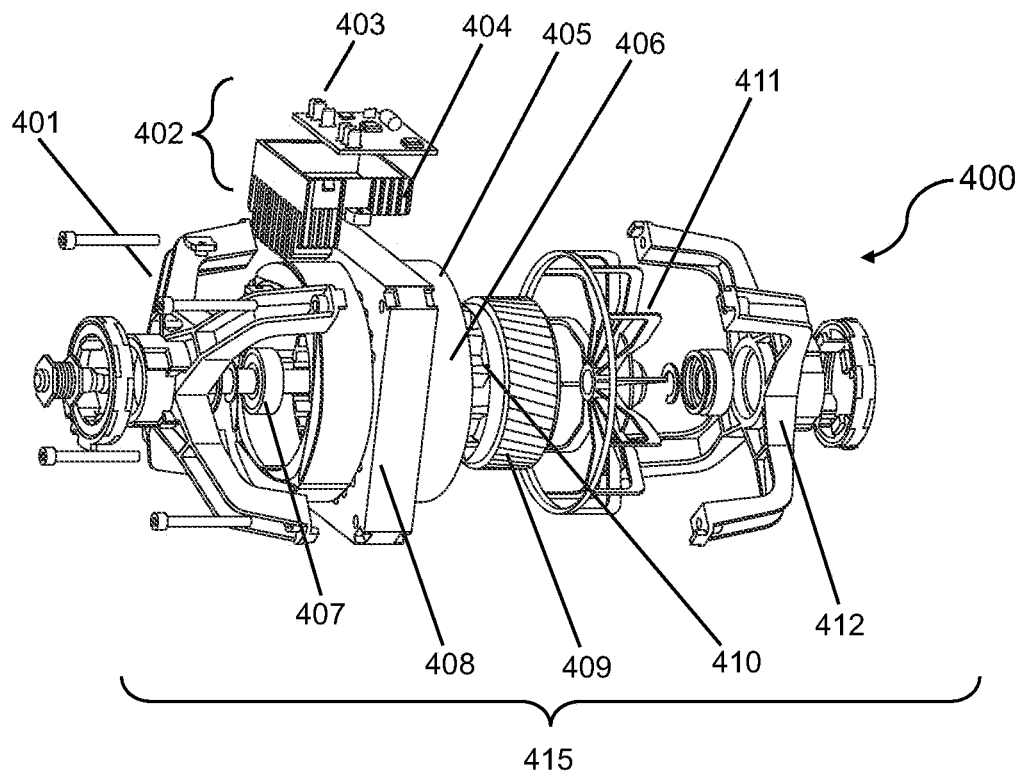
FIG. 2A illustrates an exploded view of a domestic dryer split-phase motor in accordance with one embodiment of the present disclosure.
Figure 2B:
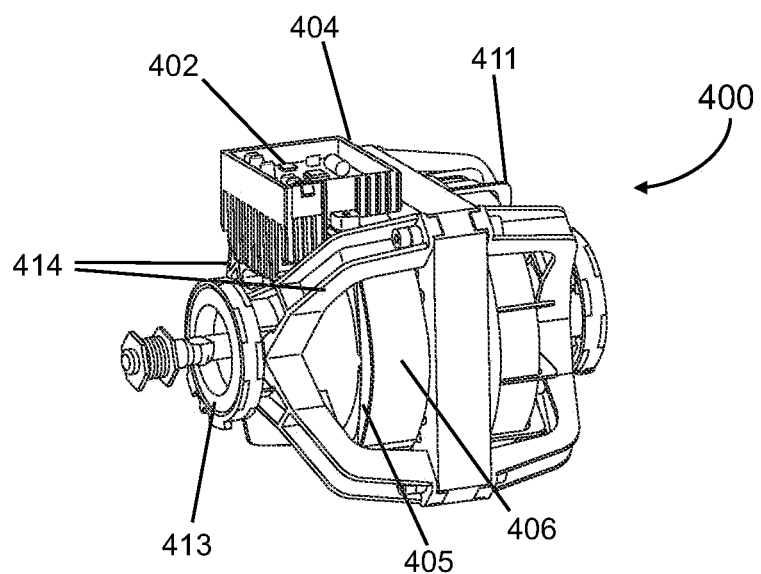
FIG. 2B illustrates a front perspective view of the motor pulley side showing the electronic starting switch assembly.

FIGS. 2A-B illustrate multiple views of one embodiment of a split-phase induction motor assembly 400 for domestic laundry dryers that includes an electronic starting switch assembly in accordance with the present disclosure. FIG. 2A depicts an exploded, pulley side perspective view of the motor assembly 400 and FIG. 2B depicts a front assembled perspective view of the motor assembly 400 showing the electronic starting switch assembly 402.

The depicted embodiment of the motor 400 has a pulley side end-shield assembly 401 that includes a pulley side end-shield frame structure, fastening screws and a hub ring 413. The electronic starting switch assembly 402 includes an electronic starting switch assembly printed circuit board 403 and a housing 404 to mount the PCB board. The electronic starting switch assembly PCB 403 has terminals connected to power sources (e.g., 120V AC and 240V AC), and a dryer heater to operate a household dryer. The housing 404 can include room to hold the PCB inside as well as a heat-sink to dissipate the heat generated by the power switch components during operation. The stator windings include main windings 405 and auxiliary windings 406, both embedded inside the slots 90 electrical degrees apart. The shaft and bearings system 407 has a shaft and two bearing assemblies to provide a rotating assembly. Stator core 408 can be made of silicon steel material to provide the main magnetic field path and to host the windings' structure. The motor rotor 409 includes a squirrel cage core structure with aluminum casting rotor winding that has slot conductor bars as well as an end ring 410. The end ring 410 of the rotor can have fan wings that generate airflow, passing over the heat-sink fins of the electronic switch assembly 402. The fan wheel 411 can generate airflow in the environment around the motor to improve the overall heat dissipation. The rear-end shield 412 can have a similar structure to the pulley side end-shield. The assembled pulley side perspective view is shown in FIG. 2B. The pulley side end-shield includes a hub ring 413 and four frame arms. The two top frame arms 414 have a structure to mount the electronic switch module.

Figure 3A:
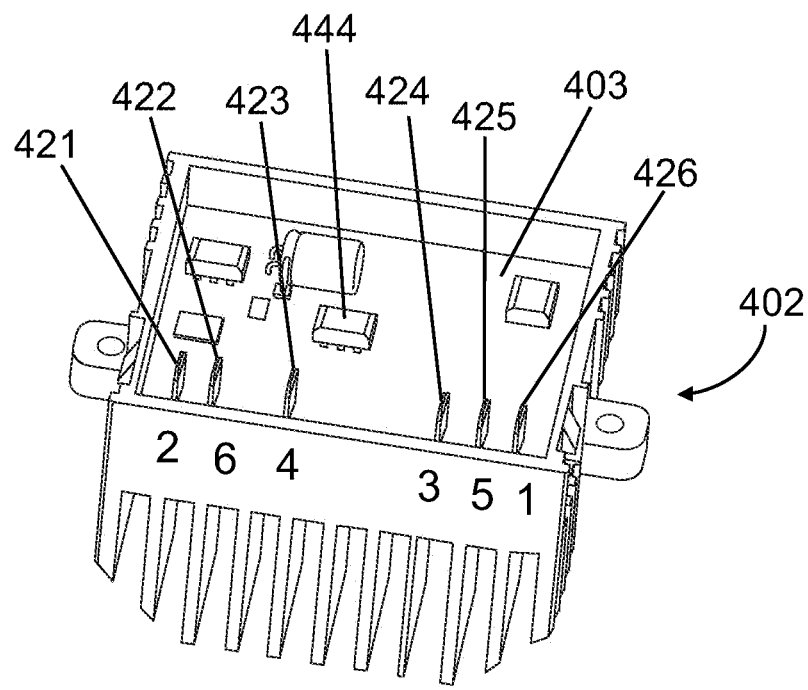
FIG. 3A illustrates a front perspective view of an electronic starting switch assembly showing the terminal numbers.

FIG. 3A illustrates a perspective close-up view of an exemplary embodiment of an electronic starting switch assembly 402. This assembly includes one or more microcontrollers 444, also referred to as a control system, controller, or microcontroller unit (MCU), an electronic printed circuit board (PCB) 403, and a housing 404 that can be made of cast aluminum. The MCU along with other suitable electronic components (e.g., sensors and memory) can be included within the MCU or mounted separately on the PCB to perform sensing, driving, and other functions, enabling the implementation of control algorithms to operate the electronic starting switch assembly 402.

The PCB 403 can include on-board connection terminals that mirror terminals used in typical centrifugal starting switches of household dryers. This can facilitate backwards compatibility. That is, by providing the same number and arrangement of a conventional centrifugal starting switch, a centrifugal starting switch assembly can be easily replaced by an electronic starting switch assembly of the present disclosure. The terminals are typically numbered 2-6-4-3-5-1 on a centrifugal switch part. In particular, terminal one 426 and terminal two 421 are the connection terminals for the dryer heater, terminal four 423 and terminal five 425 are the terminals for the main winding connection, and terminal three 424, and terminal four 423 are the terminals for the auxiliary winding connection based on the starting speed status. Terminal six 422 is a terminal for connecting buzzer circuitry 427. The buzzer circuitry can be configured to generate an audible notification when the dryer operation is complete.

Figure 3B:
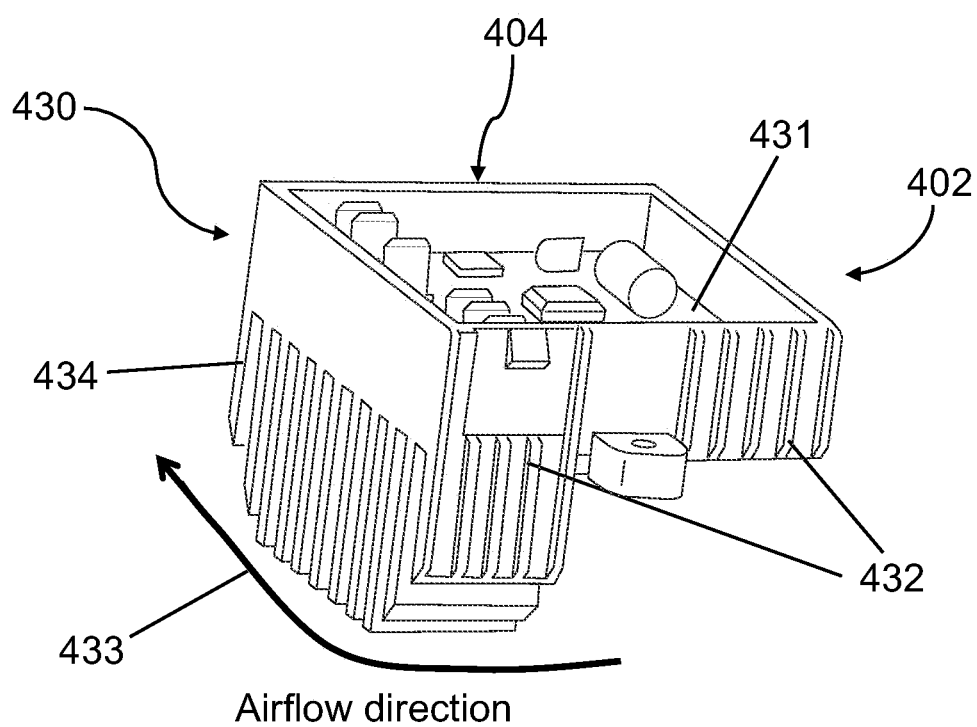
FIG. 3B illustrates a side perspective view of the electronic starting switch assembly showing the airflow direction through the wind wings.

The electronic starting switch assembly 402 shown in FIGS. 3A-B includes a housing 404. In the depicted embodiment, the housing 404 provides a place for a printed circuit board (PCB) 431 to be mounted that hosts the electronic starting switch assembly electronics and can include an integral heat-sink 430 that frames the PCB and to dissipate heat generated by the electronic components. In general, a typical domestic dryer heater can consume about 5 kW of power with about 20 Amps of current. To provide suitable heat dissipation, the heat-sink 430 can have a specialized shape to fit within a space envelope around the limited pulley side end-shield where an electronic switch assembly can be installed within \a household dryer unit. Specifically, the space envelop can include the span between the two frame legs 414 in FIG. 2B of the pulley side end-shield and the in-depth from motor stator end-windings to the open area of the hub ring 413, as depicted in FIG. 2B.

Furthermore, FIGS. 3A-B illustrate front and side perspective views of an exemplary embodiment of an electronic starting switch assembly 402 that includes following characteristics. The heat-sink 430 can include a front body 434 and side sections 432. The heat-sink is shaped to fit the limited space and to engage and mount to the two frames of the end-shield. The central wings have a higher height, and the side wings a shorter height to accommodate the space envelope and mounting location. The heat-sink can be fastened with screws via brackets on the side, which allows for a simple and easy installation and integration with the end-shield structure. The contour of the heat-sink facilitates effective heat dissipation within the limited space. The number of wings, gap width, and other heat-sink parameters can vary to provide different heat-sink characteristics that suitable for desired heat dissipation performance.

The electronic starting switch assembly 402 can incorporate various additional features. For example, the heatsink 430 can be integral or joined with a housing 404 for supporting the PCB 403. The area above the PCB spanning the length and width to the housing 404 walls can be referred to as a pool house, which can be filled with glue, resin, or another suitable material to protect the electronic starting switch assembly components from damage due to moisture, humidity, or other environmental impacts. The glue sealing process can also improve the reliability, safety, and heat dissipation performance. The general dimensions of the housing 404 can be tailored to the distance from the stator end-windings 405 and the hub ring 413, e.g., as shown in FIGS. 2A-B. In addition, taking the airflow direction around the motor into account, the heat-sink wing grooves or slots can be aligned with the motor shaft axial direction to take advantage of the directed airflow 433 generated by the fan wings on the rotor end ring, passing through each groove to improve the heat dissipation and keep the PCB temperature low. Furthermore, extra side wings 432 can be included to increase airflow effective surface space as shown in FIG. 3B. This is one exemplary configuration of a heat-sink housing integral combination that is suitable within the space allowances of a typical split-phase induction motor for a domestic dryer that provides a large airflow area that helps to maintain a lower temperature for the electronic switch assembly.

Figure 4:
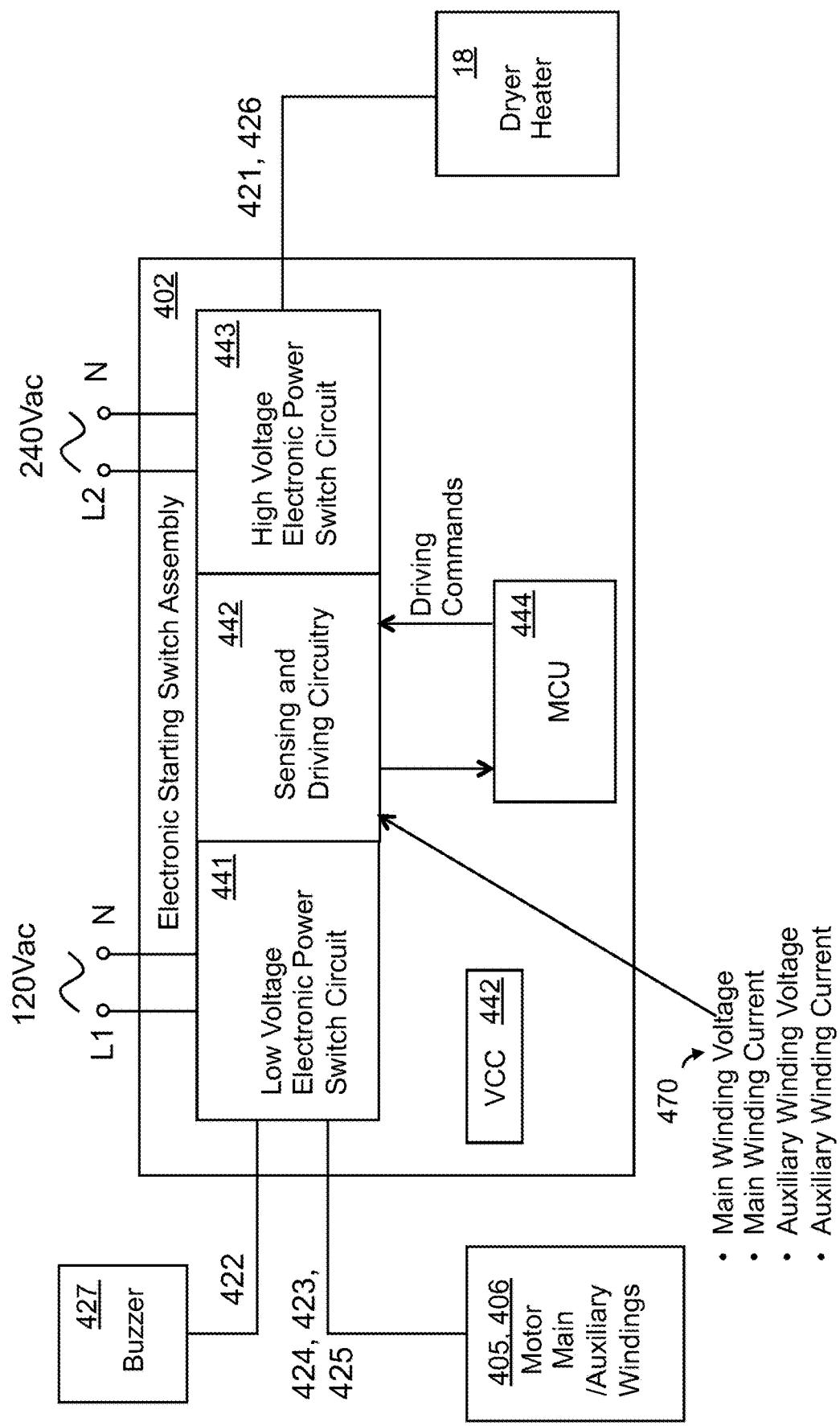
FIG. 4 illustrates a functional block diagram in accordance with one embodiment of the present disclosure showing control functionality and logic.

The electronic starting switch assembly can include a combination of different electronic components, including, but not limited to, one or more voltage supplies, one or more electronic power switch circuits, sensing and driving circuitry, and a controller. Referring to FIG. 4, a representative block diagram of one embodiment of an electronic starting switch assembly of the present disclosure is depicted. The diagram depicts two voltage supplies (a low voltage supply L1 and a high voltage supply L2), two electronic power switch circuits (a low voltage electronic power switch circuit 441 and a high voltage electronic power switch circuit 443), sensing and driving circuitry 442, and a microcontroller unit (MCU) 444.

The low voltage electronic power switch circuit 441 can selectively connect or disconnect the L1 low voltage power source to the auxiliary winding of the split-phase induction motor. Further, the low voltage electronic power switch circuit 441 can selectively connect or disconnect the L1 low voltage power source to the buzzer 427. The high voltage electronic power switch circuit 443 can selectively connect the L2 high voltage power source to the dryer heater 18. In essence, depending on how the power switch circuits 441, 443 are driven they can connect and/or disconnect power to certain circuit components (e.g., auxiliary windings, buzzer, and dryer heater).

The controller 444 in cooperation with the sensing and driving circuitry 442 can effectively control the electronic power switch circuits 441, 443. The controller 444 can receive sensed motor characteristics from the sensing and driving circuitry 442 and issue driving commands to the sensing and driving circuitry 442 in response based on the control logic in the controller 444 that implements a suitable control algorithm. In the representative diagram for clarity and ease of understanding the sensing and driving circuitry are represented collectively, however, it should be understood that the sensing and driving circuitry can be separate circuits with individual components for accomplishing the sensing and driving functionality.

The sensing circuitry 442 or controller 444 can effectively sense the speed of the rotor based one or more of main winding and auxiliary winding voltages and currents. The controller 444 can be programmed to respond to the rotor reaching or passing a crossover rotor speed. For example, the controller 444 can be programmed to disconnect the auxiliary winding 406 from the L1 low voltage source so that more torque is generated by the motor. The controller 444 can also be programmed to connect the L2 high voltage source to the dryer heater 18 to provide operational power that effectively turns the dryer heater on. The controller 444 can also control the electronic power switch circuits 441, 443 based on other factors. For example, the controller 444 and sensing and driving circuitry 442 can cooperate to connect the L1 low voltage source to the buzzer 427 in response to a timer expiring so that the buzzer creates an audible sound (e.g., a beep) to indicate dryer operation completion, which is a popular feature for household dryers. Although the electronic power switch circuits 441, 443 are represented as single elements in FIG. 4, it should be understood that they each may include multiple discrete electronic power switch circuit components. For example, the low voltage electronic power switch circuit 441 can include two discrete electronic power switch circuits that can independently and respectively connect the L1 low power voltage to the buzzer 427 and motor main/auxiliary windings 405, 406. In essence, the power supply and switch component circuitry systems are controlled by the MCU 444 through corresponding driving circuitry.

The sensing and driving circuitry 442 and the microcontroller (MCU) 444 share a DC voltage supply VCC in 442 FIG. 4. The sensing and driving circuitry 442 can include sensing circuitry capable of detecting various main and auxiliary winding characteristics 470. In one embodiment, the sensing circuitry 442 can detect main winding phase voltage, main winding phase current, auxiliary winding phase voltage, and auxiliary winding phase current. That is, known hardware configurations of driving and sensing circuitry 442 can be utilized to implement embodiments of rotor starting speed characteristic detection methods as described herein. In alternative embodiments, the sensing circuitry 442 may include circuitry to sense additional, different, or fewer characteristics.

The controller 444 can include memory that can contain various operating parameters in connection with the split-phase motor characteristic starting method. For example, the memory may include one or more motor parameters, control coefficients, such as the values depicted graphically in FIGS. 11-14. The controller 444 can include multiple I/O ports to receive analog signals to process inside the controller to execute the algorithms and programs, and to output the commands to the driving circuitry 442 to operate the power switch components, e.g., to turn on or off the auxiliary winding, dryer heater, the buzzer, or a combination thereof.

The controller 444 can be configured with a starting control method. That is, the software, programming, and/or logic on the controller can be configured with a motor characteristic starting control method that includes the following functionality:

1) When powered on, the controller 444 transmits a command to the low voltage switch component 16, 441 of the switch assembly 402 to connect both the main winding 12, T4-423, T5-425 and the auxiliary winding 13, T3-424 into the L1 power source 14 (120V AC) to spin the motor rotor.

2) In response to the rotor 11 speed reaching a crossover point speed, the controller commands the driving circuitry 442 to operate the switch component 16, 441 of electronic starting switch assembly 15, 402 to disconnect the auxiliary winding 13 from the L1 power source (120V AC). Meanwhile, controller commands the driving circuitry 442 to operate the switch component 17, 443 to connect the dryer heater 18 to the L2 power source (240V AC), which causes the dryer heater to turn on.

3) After the speed passes the crossover starting point, the controller 444, via the sensing circuitry 442, can process the real-time feedback signals 470, monitor the speed to determine whether any extra torque load pulls back the rotor speed to below the crossover point momentarily. In response to a return crossover event, the switch circuit 16, 441 can reconnect the auxiliary winding 13, 424 into the split-phase motor stator circuit 5 to boost the torque again to restart the rotor 11, 409, which in turn will then pass over again the crossover speed. Thus, the electronic starting switch assembly 15, 402 of the present disclosure can detect not only passing over the crossover speed point during initial startup, but can also monitor the rotor speed and respond if and when the rotor speed dips below that crossover speed, e.g., any time after the initial starting period has completed. The power switch component 17, 443 to control the dryer heater 18 can be configured to take corresponding actions in response to changes in the crossover speed, e.g., turning on and off the dryer heater depending on whether the rotor speed is above or below a crossover speed point.

4) In response to the household dryer completing the drying operation, the controller 444 can command the low voltage switch circuit 441 to operate the buzzer 427 to generate an audio indication (e.g., a beep sound) to indicate that the dryer cycle is completed to a user in the vicinity of the dryer. The low voltage electronic power switch circuit 441 can include a dedicated normally closed or normally open switch that can be activated to selectively connect the buzzer 427.

FIGS. 5A-D depict diagrams of an exemplary sensing circuitry 442 of the electronic starting switch assembly 402 in accordance with the present disclosure. This includes, but is not limited to, the main winding voltage sensing circuit FIG. 5A, the auxiliary winding voltage sensing circuit FIG. 5B, the main winding current sensing circuit FIG. 5C, and the auxiliary winding current sensing circuit FIG. 5D. The voltage sensing circuits for both the main winding and auxiliary winding have an identical configuration from a topology point of view and can sense the real-time voltages with a specified sampling rate.

Figure 5C:
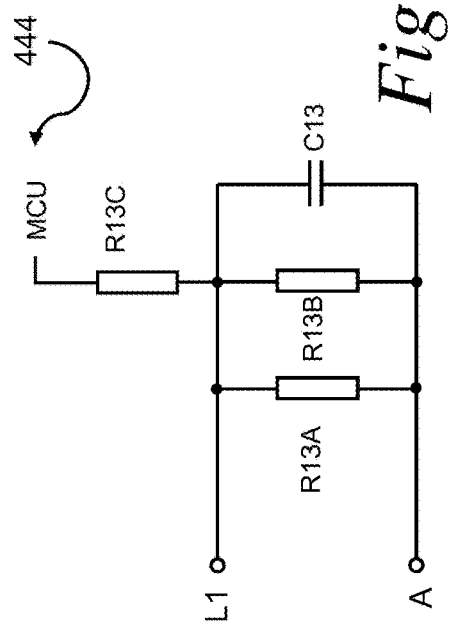
FIG. 5C illustrates an exemplary sensing circuit for sensing phase current of the main winding.
Figure 5D:
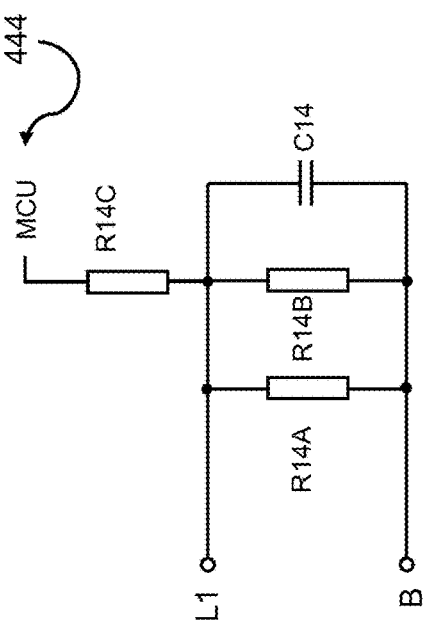
FIG. 5D illustrates an exemplary sensing circuit for sensing phase current of the auxiliary winding.
Figure 5A:
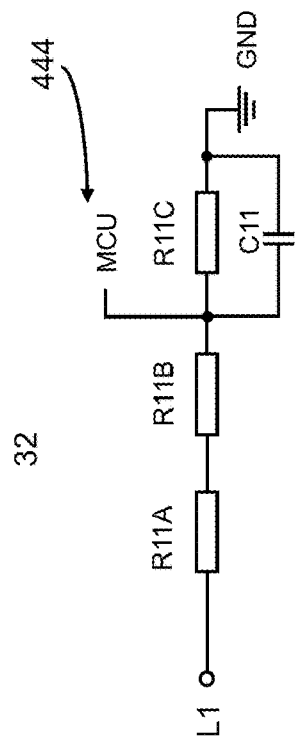
FIG. 5A illustrates an exemplary sensing circuit for sensing voltage of the main winding.

Referring to FIG. 5A, the main winding voltage 470 can be sensed between point A and ground to measure the voltage drop across the entire split phase motor circuit. As depicted in FIG. 5A, this can be done using a suitable combination of circuit components that provide desired sensing parameters such as a combination of resistor(s) (R11A, R11B, R11C) and capacitor(s) C11, e.g., connected electrically as shown. By selecting suitable values for the resistors and capacitors, voltage sensing bandwidth can be configured for a range from 0 volts to the rated voltage of 120V AC or higher, such as 140V AC, an over-voltage value specified for household dryers. The analog signal generated by the sensing circuitry can be transmitted to one of the I/O ports of the MCU 444 for use in execution of the control algorithm.

Figure 5B:
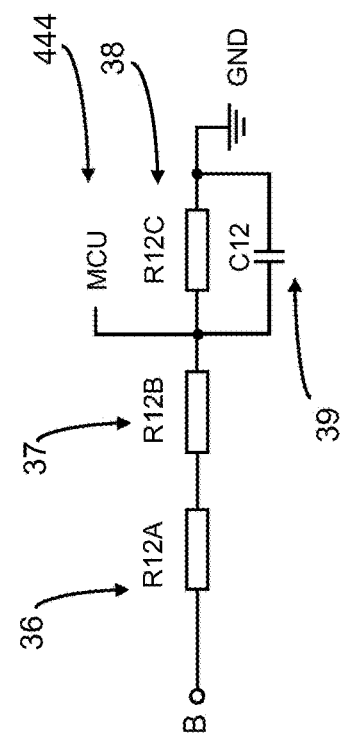
FIG. 5B illustrates an exemplary sensing circuit for sensing voltage of the auxiliary winding.

Referring to FIG. 5B, the auxiliary winding voltage 470 can be sensed between point B and ground to measure the voltage drop across the auxiliary winding 13. Notably, this voltage measurement includes the back-emf generated by the rotating field even when the motor is running and the auxiliary winding is disconnected from the rotor circuit due to the electronic starting switch assembly 15 opening switch 16, 441. As depicted in FIG. 5B, this can be done using a suitable combination of circuit components that provide desired sensing parameters such as a combination of resistor(s) (R12A, R12B, R12C) and capacitor(s) C12, e.g., connected electrically as shown. By selecting suitable values for the resistors and capacitors, the voltage sensing bandwidth can be configured for a desired range, e.g., from 0 to 140 volts. The analog signal generated by the sensing circuitry can be transmitted to one of the I/O ports of the MCU 444 for use in execution of the control algorithm.

The main winding current feedback signal 470 can be sensed by the sensing circuit shown in FIG. 5C. The main winding current passes through a combination of resistors and capacitors (e.g., resistors, R13A, R13B, R13C, and capacitor C13) having suitably selected parameters to deliver a suitable current sense range, e.g., from 0.1 amps to 25 amps, by converting the current sense range into an analog DC voltage range from 0 to 3.3 or 5.0 VDC. The analog voltage signal representing the sensed current through the main winding can be electrically communicated to one of the I/O ports of the MCU 444 for use in execution of a split phase induction motor control algorithm.

The auxiliary winding current feedback signal 470 can be sensed by the sensing circuit shown in FIG. 6C. The auxiliary winding current passes through a combination of resistors and capacitors (e.g., resistors R14A, R14B, R13C, and capacitor C14) having suitably selected parameters to deliver a suitable current sense range, e.g., from 0.1 amps to 5 amps, by converting the current sense range into an analog DC voltage range from 0 to 3.3 or 5.0 VDC. The analog voltage signal representing the sensed current through the auxiliary winding can be electrically communicated to one of the I/O ports of the MCU 444 for use in execution of a split phase induction motor control algorithm.

Figure 6A:
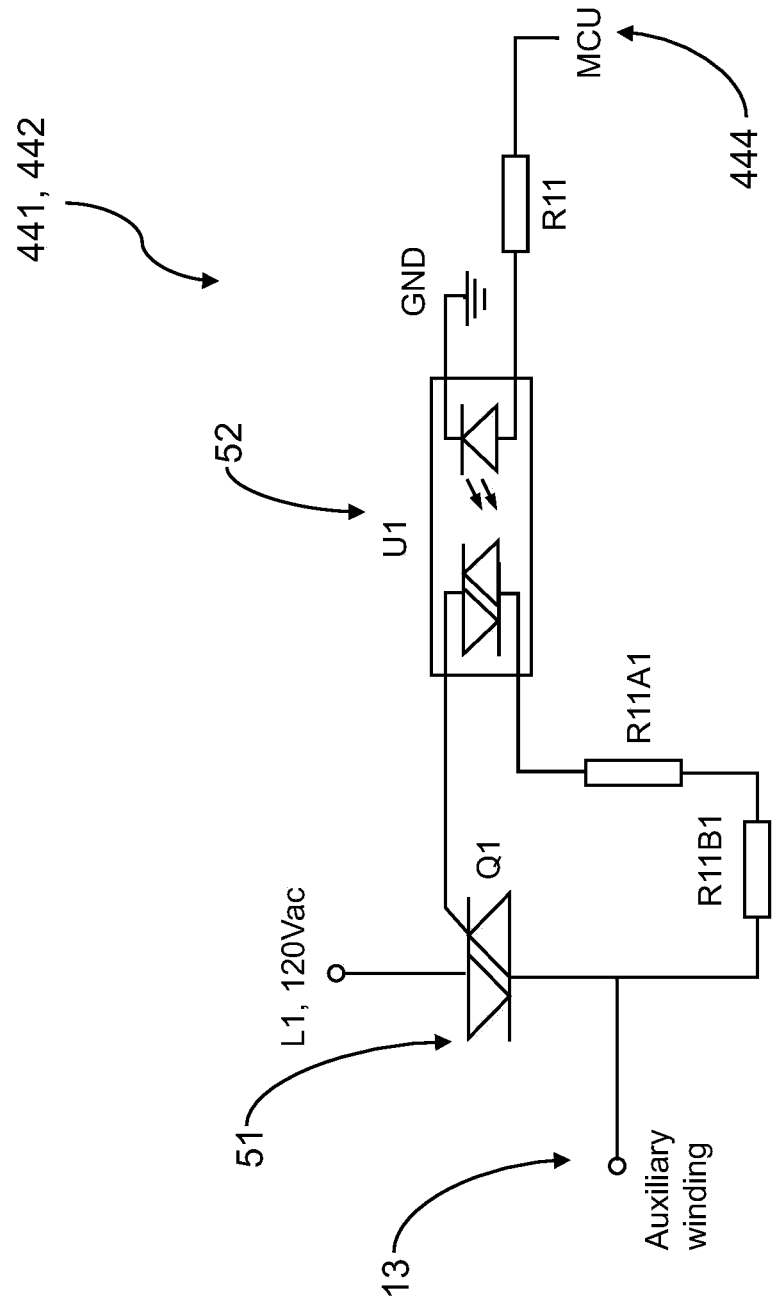
FIG. 6A illustrates an exemplary driving and power switch circuit to start a split-phase motor.

FIGS. 6A-B depict diagrams of an exemplary embodiment of the driving circuitry 442 and the power switch components, 441, 443, which selectively connect the auxiliary winding to the split phase induction motor stator circuit 5 and supply power to the dryer heater 18, respectively.

FIG. 6A illustrates a hardware circuit implementation of a portion of the electronic starting switch assembly including circuitry related to the low voltage electronic power switch circuit 441 and driving circuitry 442 of FIG. 4. The circuitry of the depicted embodiment of the present disclosure includes a triac 51, a photoelectric coupler 52, and a set of resistors, R11, R11A1, R11B1. In response to an on/off command signal from the MCU 44, e.g., a signal generated based on a split phase induction motor starting control algorithm being executed on the controller, the photocoupler 52 generates an electrical control signal Q1 that controls the triac 51, effectively connecting or disconnecting the L1 low voltage source to the auxiliary winding 13 depending on the state of the control signal Q1. Resistors and other circuit components can be included to provide biasing, current limiting, and other circuit functionality if desired.

FIG. 6B illustrates a hardware circuit implementation of a portion of the electronic starting switch assembly 402 including circuitry related to the low voltage electronic power switch circuit 441, the high voltage electronic power switch circuit 443, and driving circuitry 442. In particular, the depicted circuit diagram illustrates driving and power switches to control both the dryer heater 18 and the buzzer 427. The circuitry is configured in serial connection with a similar circuit architecture, including two triacs Q2 56, Q3 60, which each act as power switches controlling the flow of current from the L2 and L1 voltage sources respectively, two photoelectric couplers, 57, 61, and resistors R11, R11A2, R11B2, R11A3, R11B3. In response to an on/off command signal from the MCU 44, e.g., a signal generated based on a split phase induction motor starting control algorithm being executed on the controller, the photocouplers 57,61 each generate respective electrical control signals Q2, Q3 that controls their respective triacs 56, 60, effectively connecting or disconnecting the L1 low voltage source and L2 high voltage source to the buzzer 427 and heater 18 depending on the state of the control signals Q2, Q3. Resistors and other circuit components can be included to provide biasing, current limiting, and other circuit functionality if desired. In essence, the MCU 444 provides control commands to turn on/off the dryer heater based on software algorithms, resulting on the reaction of the photoelectric couplers 57, 61 that turn on/off the triac Q2 and Q3 simultaneously to connect the heater with the power L2 and the buzzer with the power L1 respectively. The buzzer circuitry can be configured in a variety of different ways to provide desired functionality, such as the buzzer being activated in response to the dryer cycle being completed or at other pre-determined stages of dryer activity.

III. Split-Phase Motor Fea Model and Analysis

Improved starting speed detection methods are provided by the present disclosure. By leveraging an improved starting speed detection method, an electronic starting switch can be utilized to start a split-phase induction motor. For example, an electronic starting switch assembly can replace a mechanical centrifugal switch in a domestic dryer. The electronic starting switch assembly can be operated based on electrical variables that include, but are not limited to, main and auxiliary windings' voltages and currents, or other electrical variables of the split phase induction motor. These electrical variables can be sensed by sensing circuitry for analysis and processing by starting algorithms. Various characteristics of a split-phase induction motor, which can be utilized to operate and control a household dryer are discussed herein. For example, several split-phase induction motor starting algorithms will be discussed herein for use in connection with an electronic starting switch assembly in accordance with the present disclosure.

According to single-phase induction motor analysis theory, ideally, if two-phase symmetric windings are mutually displaced by 90 electrical degrees, the motor generates a circular rotating field when powered by two-phase symmetric voltages. Two-phase symmetric voltages have identical amplitudes and 90 electrical degrees of phase angle between them. However, in a split-phase induction motor, the main winding and auxiliary winding are mutually displaced by 90 electrical degrees, with significantly different impedances to create a phase-splitting effect. When powered by a voltage, the currents in main winding and auxiliary winding differ in terms of amplitude and phase angle, which leads to generation of an elliptic rotating field, as opposed to circular one.

Furthermore, it should be noted that motor starting characteristics are generally influenced by transient processes. These processes can be affected by changes in motor parameters, which may occur due to saturation of the motor core's silicon-steel material. Since classic motor analysis methods based on fixed parameters and equivalent circuits may not adequately account for these constraints and characteristics, improved methods for detecting motor starting speed may be more suitable.

A. FEA Analysis Model and Control Circuit

Figure 7B:
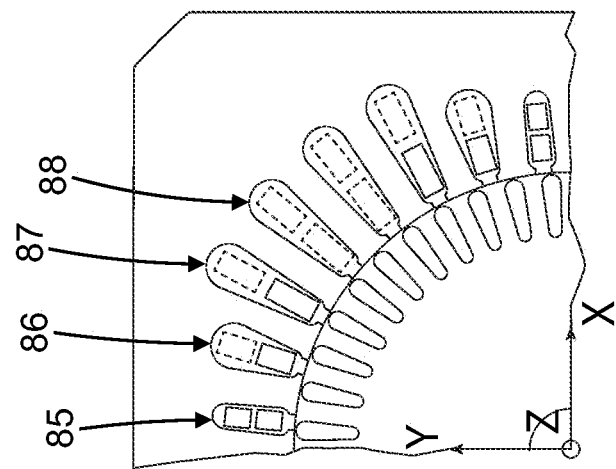
FIG. 7B illustrates a one-pole geometry model of a split-phase induction motor in Finite Element Analysis (FEA) process.
Figure 7A:
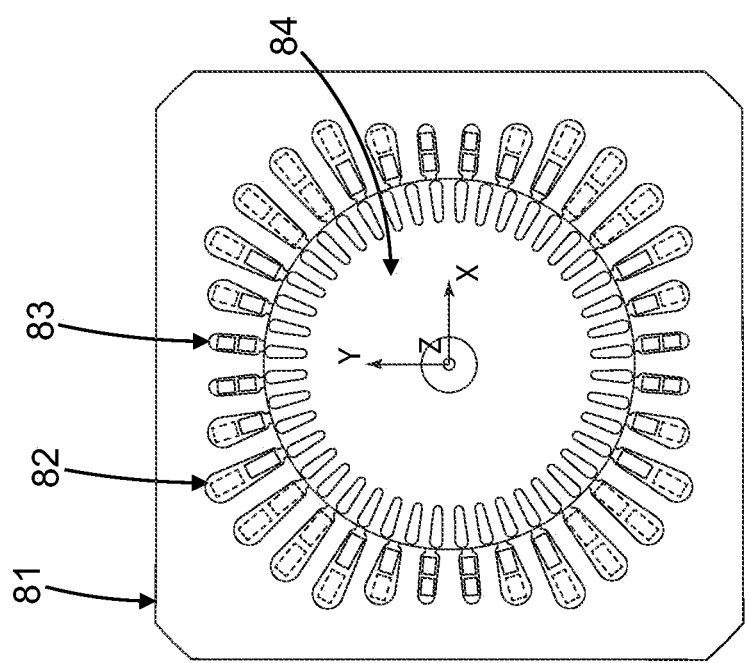
FIG. 7A illustrates an exemplary full geometry model for Finite Element Analysis of a household dryer split-phase induction motor.

The Finite Element Analysis (FEA) approach can be applied to study the starting characteristics of the comprehensive field and circuitry systems of the present disclosure. FIG. 7A illustrates a full geometric model of a split-phase motor, including the stator core structure 81, the main winding 82, auxiliary winding 83, and the rotor structure 84. The main winding and auxiliary winding are not symmetric because the auxiliary winding is energized only during an initial starting time, e.g., the first few seconds of the motor being started. To generate a sinusoidal field distribution in the airgap, the stator slots are designed to have smaller slots 85, 86, and bigger slots 87, 88 to increase the torque production capability and the usage of the stator winding material as well as the silicon steel core, as shown in FIG. 7B of the one-pole model.

Figure 8:
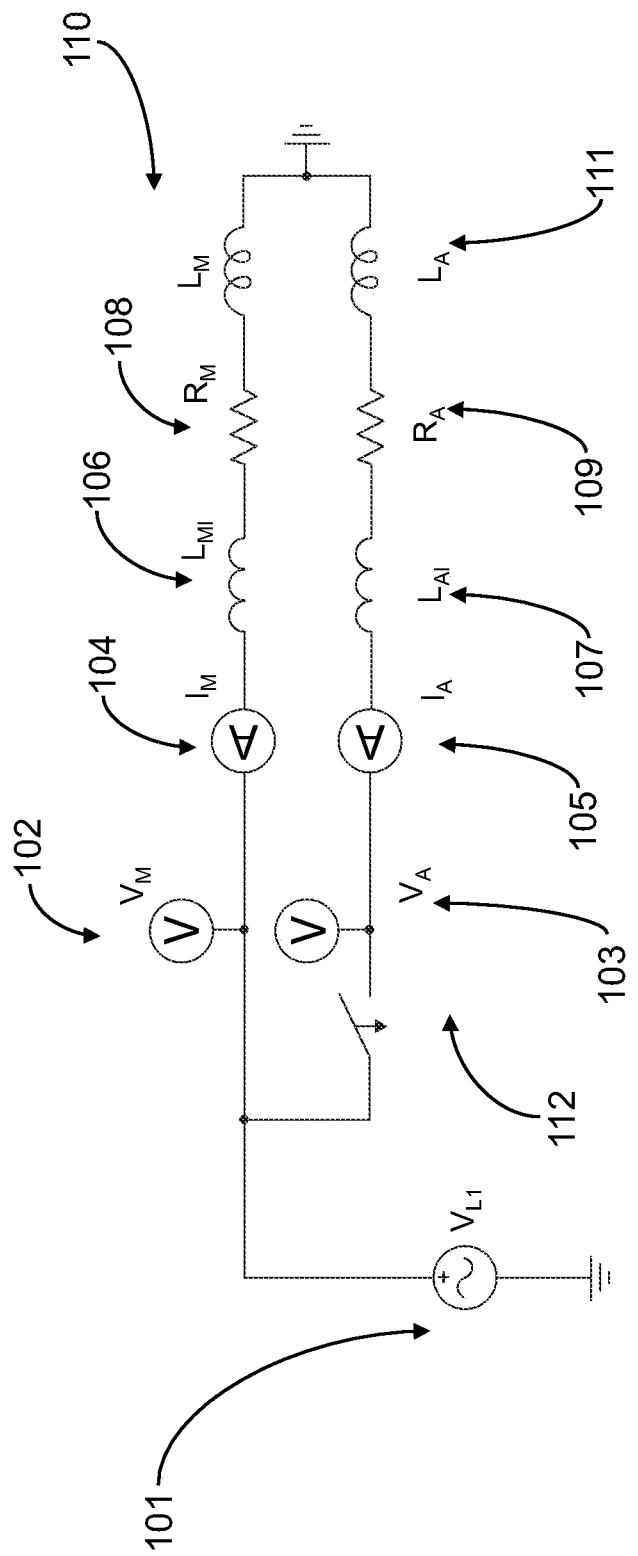
FIG. 8 illustrates an exemplary circuit diagram representation of a split-phase induction motor control system for use with a finite element analysis (FEA) process.

FIG. 8 illustrates an exemplary representative control circuit 100 that can be coupled with the FEA model of magnetic field calculations. In essence, the control circuit of FIG. 8 can be integrated with the FEA model to simulate and analyze magnetic fields within a split phase induction motor. The power voltage $V_{LI}$ 101 supplies power to the motor stator windings. In this FEA analysis model, there are two voltage measurement points, where $V_M$ 102 and $V_A$ 103 represent the measured main and auxiliary phase voltages, and two current measurement points, where $I_M$ 104 and $I_A$ 105 represent the main and auxiliary phase currents, respectively. The inductances $L_{MI}$ 106 and $L_{AI}$ 107 represent the main and auxiliary winding end-leakage inductances. The resistances $R_M$ and $R_A$ represent the main and auxiliary winding resistances. The inductances $L_M$ and $L_A$ represent the main and auxiliary winding inductances respectively. The auxiliary winding switch S_Aux 112 allows the auxiliary winding to be selectively connected and disconnected from the rest of the circuit.

B. FEA Analysis Simulation And Testing Results

Figures 9A, 9B:
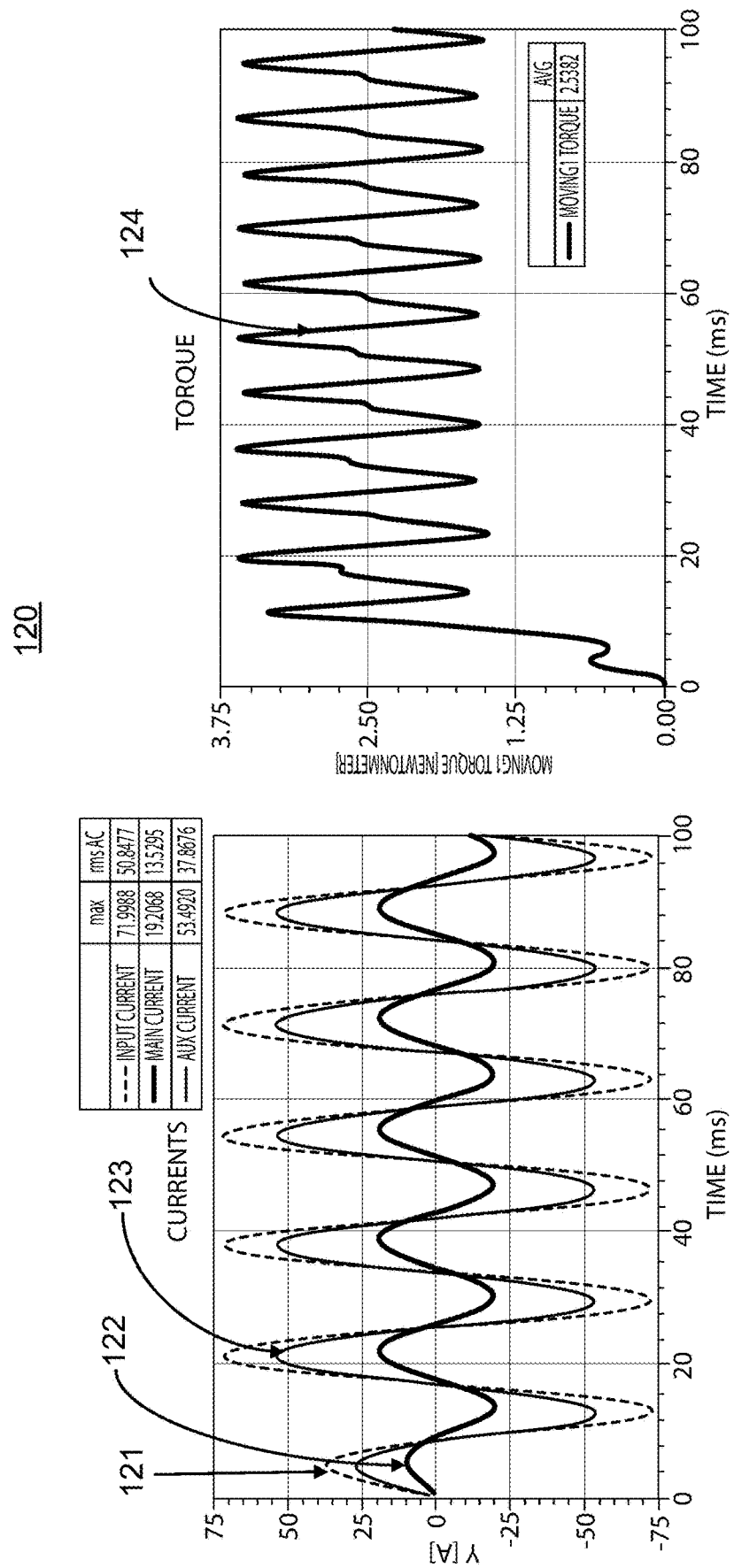
FIG. 9A presents exemplary finite element analysis (FEA) simulation results, displaying the main, auxiliary, and total input current waveforms of a household dryer split-phase induction motor in a locked-rotor state.
FIG. 9B shows exemplary FEA simulation results, illustrating the output shaft torque characteristics over time for a household dryer split-phase induction motor in a locked-rotor state.

The locked-rotor operational status can be simulated in real-time to study the characteristics of a household dryer split-phase induction motor. FIG. 9A illustrates the current waveforms of the total input current 121, main winding current 122, and auxiliary winding current 123 versus time in locked-rotor status. The main winding current and auxiliary winding current differ in amplitude and have a small phase angle difference, indicating that the motor generates an elliptical field around the airgap. An elliptical field can produce torque with an added torque ripple, as shown in FIG. 9B, which depicts the torque characteristic versus time 124 in locked-rotor operational status. The torque curve 124 demonstrates that there is sufficient average torque, due to the phase-splitting effect to start the motor. However, the elliptical field also produces a significant torque ripple superimposed on the average torque.

This system FEA model couples the non-linear field calculations with the control circuit, providing a powerful tool to study dynamic characteristics of a household dryer split-phase motor. To simulate the dynamics, a series of non-linear field calculations can be performed to explore the transient characteristics during the real-time starting process. The simulation results can be verified by household dryer split-phase motor system tests. The FEA model and real-time system simulation methodology can be effective for starting speed detection based on these electrical variables (e.g., main and auxiliary winding voltages and currents, which can be utilized to derive rotor speed).

IV. Positive and Negative Sequence Currents on the Synchronous D-Q Frame

Theoretically, when one phase winding of a single-phase motor is powered on by an AC voltage, it generates only a pulsation field in the airgap. This pulsating field can be decomposed into two rotating fields, a positive sequence field and a negative sequence field in the frequency domain. Both positive and negative sequence fields produce corresponding torques.

Figure 10:
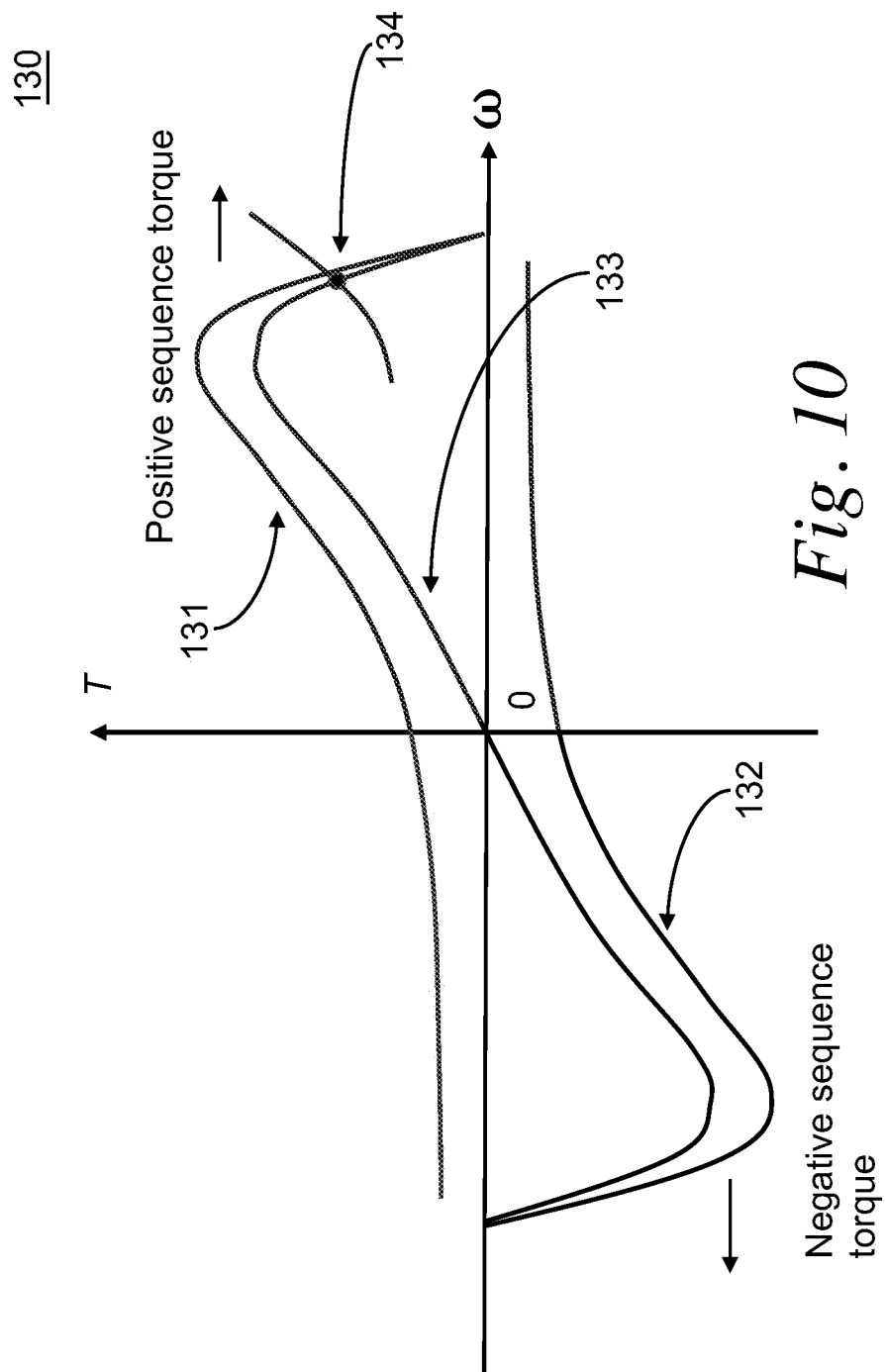
FIG. 10 illustrates theoretical torque characteristics versus speed, showing the positive, negative sequence and combined torques of a single-phase winding motor.

FIG. 10 describes the torque versus speed characteristics for both positive and negative sequence torques. The positive sequence torque characteristic curve 131 resembles a typical three-phase induction motor in the forward rotating direction. Conversely, the negative sequence torque characteristic curve 132 has the same general shape of the positive one, but in the reverse direction. The combination of the positive and negative torques results in the single-phase winding torque curve 133, which shows zero-output torque at zero speed.

When the motor is assisted by an external force or torque in any direction (e.g., the positive or negative direction), the single-phase winding motor generates sufficient torque to rotate the rotor to a load working point 134. This helps explain why split-phase induction motors utilize special starting control methodology. Thus, when a single-phase winding motor is rotating, such as at the working point 134, there are both positive and negative sequence torques simultaneously present. Consequently, there are both positive sequence (forward) current and negative sequence (backward) current in the frequency domain.

Therefore, the split-phase motor can be analyzed as a standard two-phase winding motor, whether both the main and auxiliary windings are powered on or only the main winding is connected and the auxiliary winding is disconnected. By treating the circuit this way, advanced multiple-phase motor control frame transformation methodologies can be applied to study the characteristics and inform novel speed detection methods during the starting process.

Figure 11:
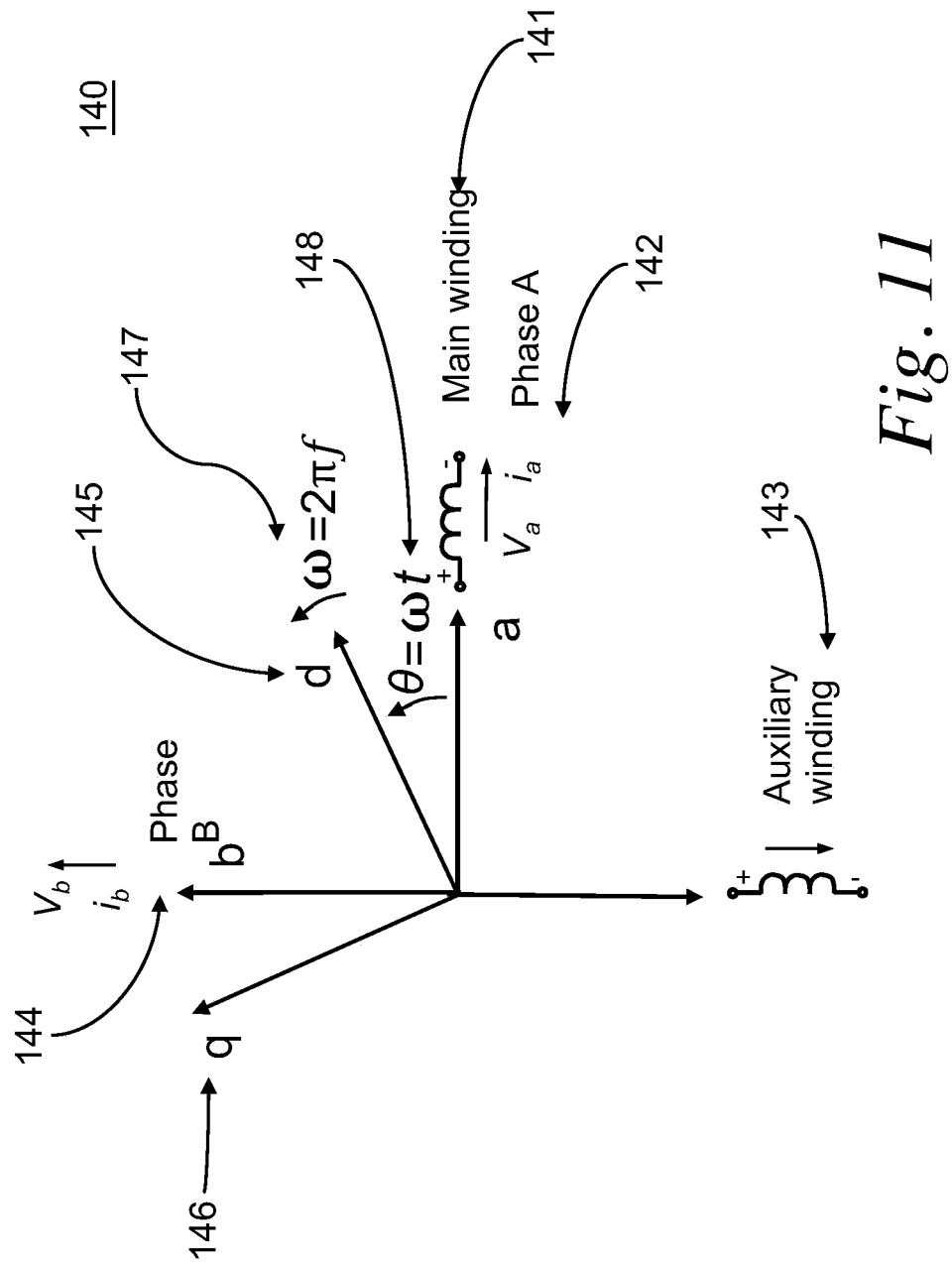
FIG. 11 illustrates exemplary analysis reference frame axis systems, showing the synchronous speed d-q axis frames and the static two-phase a-b axis frames with Phase-A aligning to the main winding, and Phase-B in the opposite direction of the auxiliary winding.

The relationship between the main winding and auxiliary winding is described in connection with a motor stator frame of reference system in FIG. 11. Since the main winding and auxiliary winding are mutually displaced by 90 electrical degrees, the main winding 141 is defined to align with the phase-A frame 142, represented by $V_a$ and $i_a$. The auxiliary winding is defined to align with an axis that leads the main winding axis by 90 electrical degrees 143. Furthermore, the phase-B frame is defined to lag the phase-A frame by 90 electrical degrees 144, represented by $V_b$ and $i_b$. Thus, the phase-B frame is aligned in the opposite direction of the auxiliary winding, indicating that the phase-B axis lags the auxiliary winding by 180 electrical degrees, as shown in FIG. 11.

When the synchronous speed reference frame d-q axis 145, 146 is introduced using the Park transformation, it converts the positive and negative sequence currents from the frequency domain into the time domain, as shown in FIG. 10. The fundamental forward or positive sequence currents are transferred as DC component variables on the frame d-q axis 145, 146. That is, when the positive sequence currents (AC currents) are viewed in the synchronous reference frame (d-q axis), they appear as constant DC values rather than oscillating values. Meanwhile, the backward or negative sequence currents are transferred as second-order harmonic currents on the synchronous speed d-q axis 145, 146. Furthermore, the second-order harmonic currents can be decoupled from the fundamental currents (DC components) and filtered out using suitable filtering techniques. The real-time continuous forward DC currents can be used to detect starting speeds for a household dryer split-phase induction motor. Put simply, the real-time continuous forward DC currents enable accurate detection of the starting speeds of a household dryer split-phase induction motor.

A. POSITIVE SEQUENCE CURRENTS COMPUTATION

Applying the Park transformation to the two-phase system, Phase-A 142 and Phase-B 144 currents are transformed into the synchronous speed frame d-q axis currents as follows:

$$\begin{bmatrix} i_d \\ i_q \end{bmatrix} = \begin{bmatrix} \cos(\theta) & \sin(\theta) \\ -\sin(\theta) & \cos(\theta) \end{bmatrix} \begin{bmatrix} i_a \\ i_b \end{bmatrix} \quad (1)$$

Where,
$i_d$: d-axis current on the synchronous speed frame d-q axis,
$i_q$: q-axis current on the synchronous speed frame d-q axis,
$i_a$: Phase-A winding current,
$i_b$: Phase-B winding current.

Since Phase-B winding 144 lags to Phase-A winding 142 with 90 electrical degrees and the auxiliary winding 143 leads the main winding 141 with 90 electrical degrees, the relationship of the two-winding currents and the two-phase currents can be defined as, $$i_a(t) = i_M(t) \quad (2)$$

$$i_b(t) = -K_{AM} \cdot i_A(t) \quad (3)$$

Where, $$k_{AM} = \frac{k_{dp1A} W_A}{k_{dp1M} W_M} \quad (4)$$

$i_M$: the main winding phase current,
$i_A$: the auxiliary winding current,
$K_{AM}$: the effective winding turn ratio between the auxiliary and main windings,
$W_A$: the auxiliary winding total number of turns in series,
$W_M$: the main winding total number of turns in series,
$k_{dp1A}$: the fundamental winding factor of the auxiliary winding,
$k_{dp1M}$: the fundamental winding factor of the main winding.

Referencing the variables on the synchronous speed frame d-q axis, the forward current components are represented by the DC current components, while the backward current components can be expressed as second-order harmonic components, which can be filtered out. Thus, the DC current components are the forward currents in the synchronous speed frame d-q axis, $$\begin{cases} i_{d0} = \frac{1}{T_2} \int_{t-T_2/2}^{t+T_2/2} i_d(t) dt = \frac{1}{T_2} \left[ \text{int}\left(i_d, t + \frac{T_2}{2}\right) - \text{int}\left(i_d, t - \frac{T_2}{2}\right) \right] \\ i_{q0} = \frac{1}{T_2} \int_{t-T_2/2}^{t+T_2/2} i_q(t) dt = \frac{1}{T_2} \left[ \text{int}\left(i_q, t + \frac{T_2}{2}\right) - \text{int}\left(i_q, t - \frac{T_2}{2}\right) \right] \end{cases} \quad (5)$$

Where, the function int(f,t) is an integral function that can be expressed as, $$\text{int}(f,t) = \int_0^t f(t)dt \tag{6}$$

$i_{d0}$: the d-axis forward current in the frame d-q axis,
$i_{q0}$: the q-axis forward current in the frame d-q axis,
$T_2$: the period of the $2^{nd}$ order signals.

On the synchronous speed frame d-q axis, the forward DC current components are the currents that can be approximately calculated by, $$\begin{cases} i_{d0} = \dfrac{1}{T_2}[\text{int}(i_d, t) - \text{int}(i_d, t - T_2)] \\ i_{q0} = \dfrac{1}{T_2}[\text{int}(i_q, t) - \text{int}(i_q, t - T_2)] \end{cases} \tag{7}$$

Finally, at the time t, the forward current magnitude is calculated by, $$I_{m0} = \sqrt{i_{d0}^2 + i_{q0}^2} \tag{8}$$

Where,
$I_{m0}$: the forward magnitude current in the frame d-q axis.

Figure 12B:
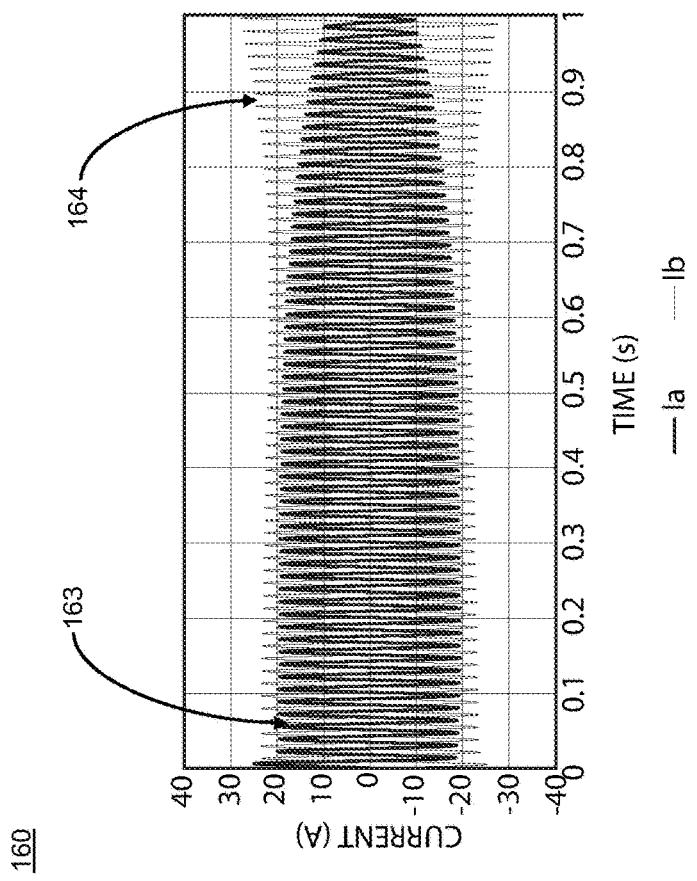
FIG. 12B illustrates exemplary FEA simulation result showing the referred Phase-A and Phase-B phase currents at the speed from 0 to 1,800 RPM over the first second of starting time.
Figure 12A:
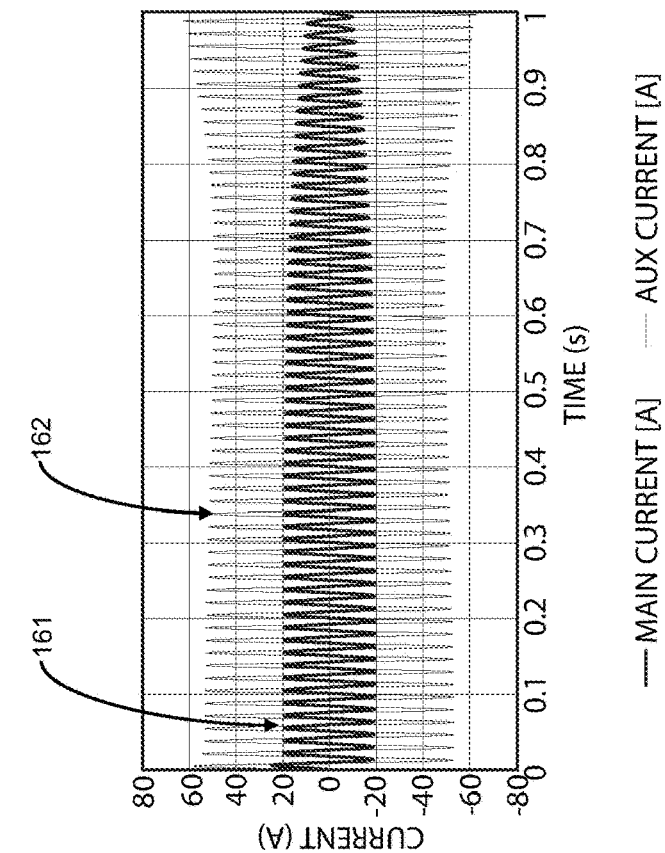
FIG. 12A illustrates exemplary FEA simulation results showing the main and auxiliary winding phase currents at the speed from 0 to 1,800 RPM over the first second of starting time.

An exemplary computation of the forward currents of a household dryer split-phase motor can be simulated under conditions where the rotor speed ranges from 0 to a synchronous speed of 1,800 RPM, and the auxiliary winding is connected to the power supply the whole time. FIG. 12A illustrates exemplary simulation results showing the main phase current 161 and auxiliary winding phase currents 162 at speeds from 0 to 1,800 RPM over a starting time of 1 second, compared with the phase Phase-A current 163 and Phase-B current 164 in a-b axis frame, as shown in FIG. 12B. The relationship between the Phase-B current 164 and the auxiliary winding phase current 162 defined in Equation 3 is reflected in the current waveforms shown in FIGS. 12A-B.

Figures 13A, 13B:
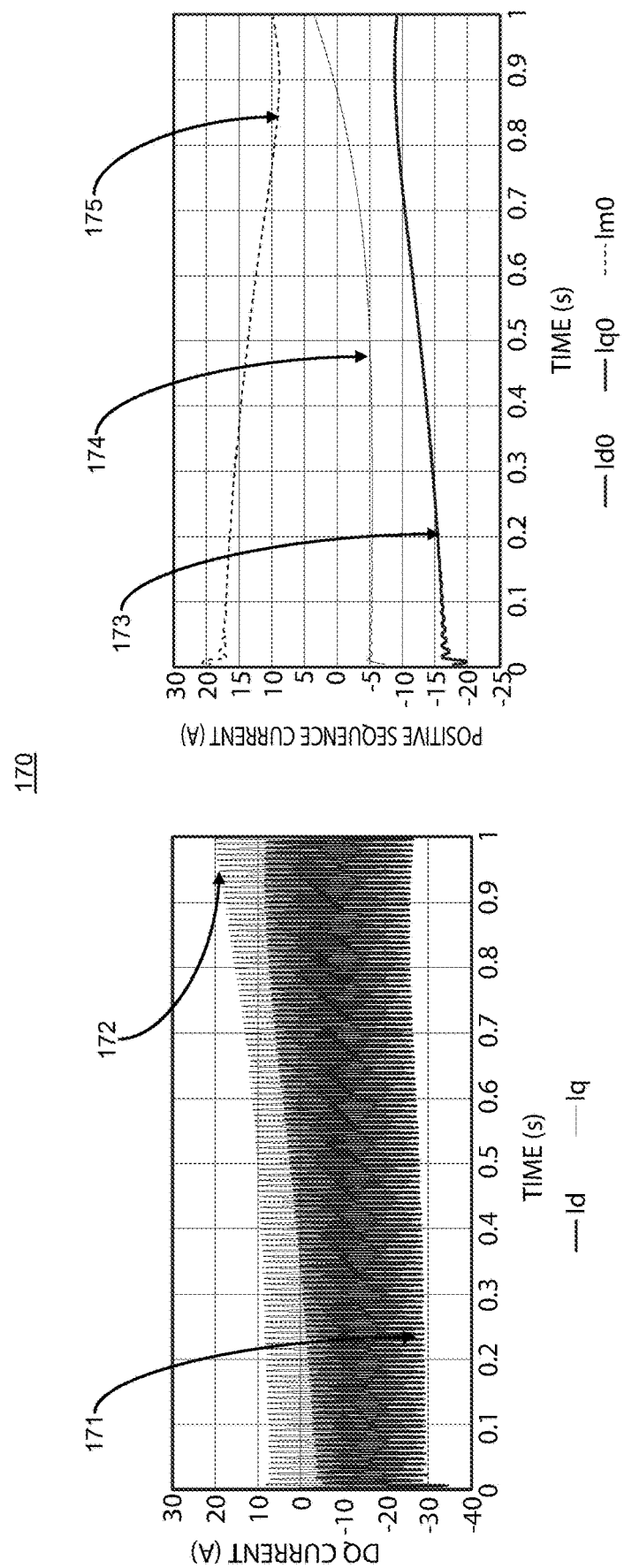
FIG. 13A illustrates exemplary FEA simulation results showing the transformed synchronous speed frame d-q axis current waveforms at speeds from 0 to 1,800 RPM over the first second of starting time.
FIG. 13B illustrates exemplary FEA simulation result showing the filtered d-q axis currents, forward current DC components and forward magnitude current at speeds from 0 to 1,800 RPM over the first second of starting time.

Furthermore, FIG. 13A illustrates exemplary simulation results showing the referenced two-phase currents based on the synchronous speed d-q axis frame at speeds from 0 to 1,800 RPM over a starting time of 1 second. In this frame, both the transformed positive d-axis current 171 and the q-axis current 172 include DC components for the forward currents and second-order harmonic components for the backward currents. FIG. 13B illustrates the exemplary simulation results showing the filtered DC components of the d-q axis current waveforms ($i_{d0}$, $i_{q0}$), 173, 174 which represent the pure forward current characteristics.

The forward magnitude current Imo waveform 175 is directly related to the positive sequence torque characteristic close to the working point 134 speed range shown in FIG. 10, and therefore facilitates detection of the starting speed, which will be described in more detail in the following section.

B. Computation of Negative Sequence Currents and Main Phase Magnitude Current

As mentioned previously, the main-phase magnitude current is composed of the forward and the backward current components, as shown in FIG. 10. To accurately calculate the main-phase magnitude current, the negative sequence current should be calculated also. Applying the same methodology for the positive sequence current, the backward current corresponds to the second-order components in the d-q axis frame system. By generating a negative d-q axis frame system that rotates with the negative synchronous speed, the backward current can be represented as the DC components, while the forward current corresponds to the second-order components in the negative d-q axis frame system. Thus, the negative d-q axis currents can be derived in the same way as that for the positive d-q axis frame currents by using -θ to replace θ, which is expressed as, $$\begin{bmatrix} i_{d-} \\ i_{q-} \end{bmatrix} = \begin{bmatrix} \cos(\theta) & -\sin(\theta) \\ \sin(\theta) & \cos(\theta) \end{bmatrix} \begin{bmatrix} i_a \\ i_b \end{bmatrix} \tag{9}$$

Where,
$i_{d-}$: d-axis current in the negative d-q frame system,
$i_{q-}$: q-axis current in the negative d-q frame system.

Based on the negative d-q frame system, after filtering the second-order components, the DC components of the negative d-q currents, or the second-order components of the positive d-q currents, can be calculated by $$\begin{cases} i_{d2} = \dfrac{1}{T_2}[\text{int}(i_{d-}, t) - \text{int}(i_{d-}, t - T_2)] \\ i_{q2} = \dfrac{1}{T_2}[\text{int}(i_{q-}, t) - \text{int}(i_{q-}, t - T_2)] \end{cases} \tag{10}$$

Where,
$i_{d2}$: the d-axis $2^{nd}$ order current in the frame d-q axis,
$i_{q2}$: the q-axis $2^{nd}$ order current in the frame d-q axis,
$T_2$: the period of the $2^{nd}$ order signals.

Then the variables in time domain can be transformed into the frequency domain. The transient currents of the two-phase a-b frame system can be expressed as, $$\begin{bmatrix} i_a \\ i_b \end{bmatrix} = \begin{bmatrix} \cos(\theta) & -\sin(\theta) \\ \sin(\theta) & \cos(\theta) \end{bmatrix} \begin{bmatrix} i_{d0} \\ i_{q0} \end{bmatrix} + \begin{bmatrix} \cos(\theta) & \sin(\theta) \\ -\sin(\theta) & \cos(\theta) \end{bmatrix} \begin{bmatrix} i_{d2} \\ i_{q2} \end{bmatrix} \tag{11}$$

Or $$\begin{cases} i_a = (i_{d0} + i_{d2})\cos(\theta) + (i_{q2} - i_{q0})\sin(\theta) \\ i_b = (i_{d0} - i_{d2})\sin(\theta) + (i_{q0} + i_{q2})\cos(\theta) \end{cases} \tag{12}$$

Therefore, the magnitude currents of the two-phase a-b frame system in frequency domain can be calculated by, $$\begin{cases} I_{am} = \sqrt{(i_{d0} + i_{d2})^2 + (i_{q0} - i_{q2})^2} \\ I_{bm} = \sqrt{(i_{d0} - i_{d2})^2 + (i_{q0} + i_{q2})^2} \end{cases} \tag{13}$$

Where,
$I_{am}$: Phase-A magnitude current in the frame a-b axis frame system,
$I_{bm}$: Phase-B magnitude current in the frame a-b axis frame system.

Finally, the main winding phase magnitude current and auxiliary winding phase magnitude current can be obtained by, $$\begin{cases} I_M = I_{am} \\ I_A = I_{bm}/k_{AM} \end{cases} \tag{14}$$

Where,
$I_M$: main winding phase magnitude current,
$I_A$: auxiliary winding phase magnitude current.

Figures 14A, 14B:
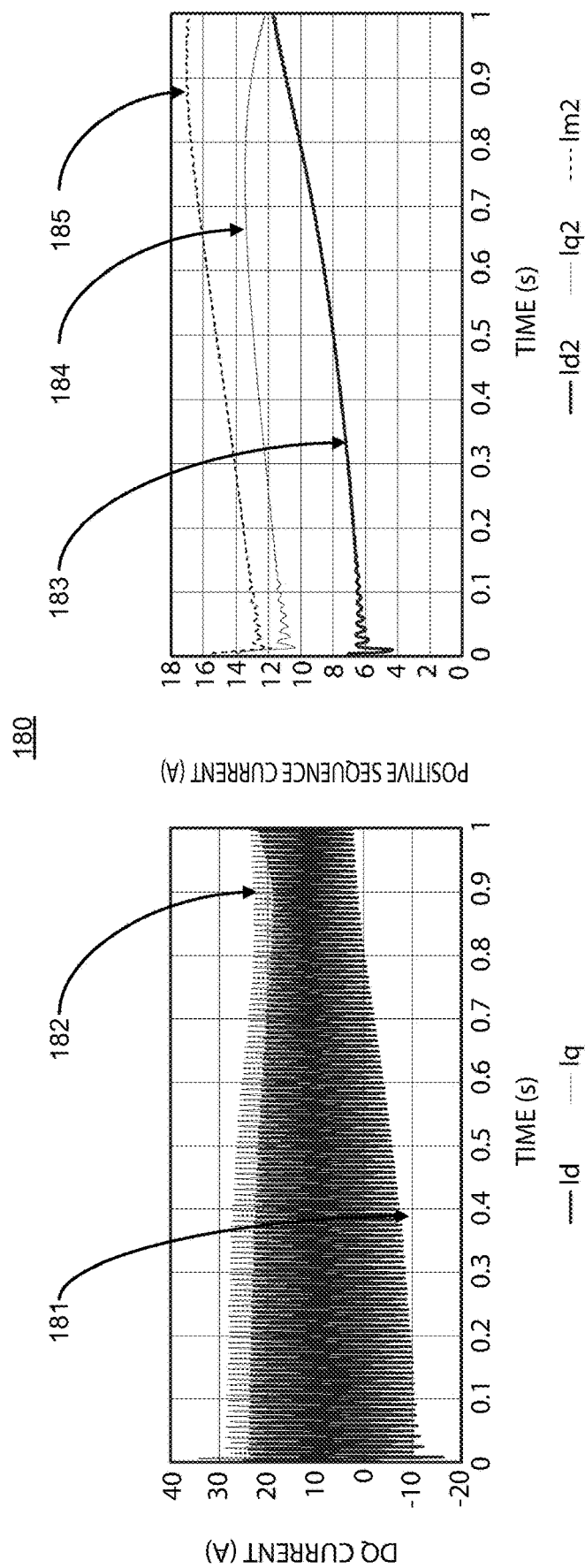
FIG. 14A illustrates exemplary FEA simulation results showing the transformed negative synchronous speed frame d-q axis current waveforms at speeds from 0 to 1,800 RPM over the first second of starting time.
FIG. 14B illustrates exemplary FEA simulation results showing the filtered negative d-q axis currents, backward (or second harmonic) current DC components, and backward (or second harmonic) magnitude current at speeds ranging from 0 to 1,800 RPM over the first second of starting time.

Comparing with the FIG. 13A simulation results showing the positive d-q axis frame system, the currents are simulated here based on the negative d-q axis frame system to calculate the currents $i_{d-}$ and $i_{q-}$ curves. FIG. 14A illustrates exemplary simulation results showing the $i_{d-}$ 181 and $i_{q-}$ 182 current curves based on the negative synchronous speed d-q axis frame at speeds from 0 to 1,800 RPM over 1 second of starting time. FIG. 14B illustrates exemplary simulation results showing the DC current components of the negative d-q axis currents $i_{d2}$ 183, $i_{q2}$ 184 and the magnitude $i_{m2}$ 185 after filtering out the positive sequence currents, which are derived as the second-order harmonic currents. As the speed increases toward the synchronous speed, the forward current DC components' magnitude 175 decreases significantly as shown in FIG. 13B. Conversely, the backward current DC components' magnitude 185 increases substantially as shown in FIG. 14B.

Figure 15:
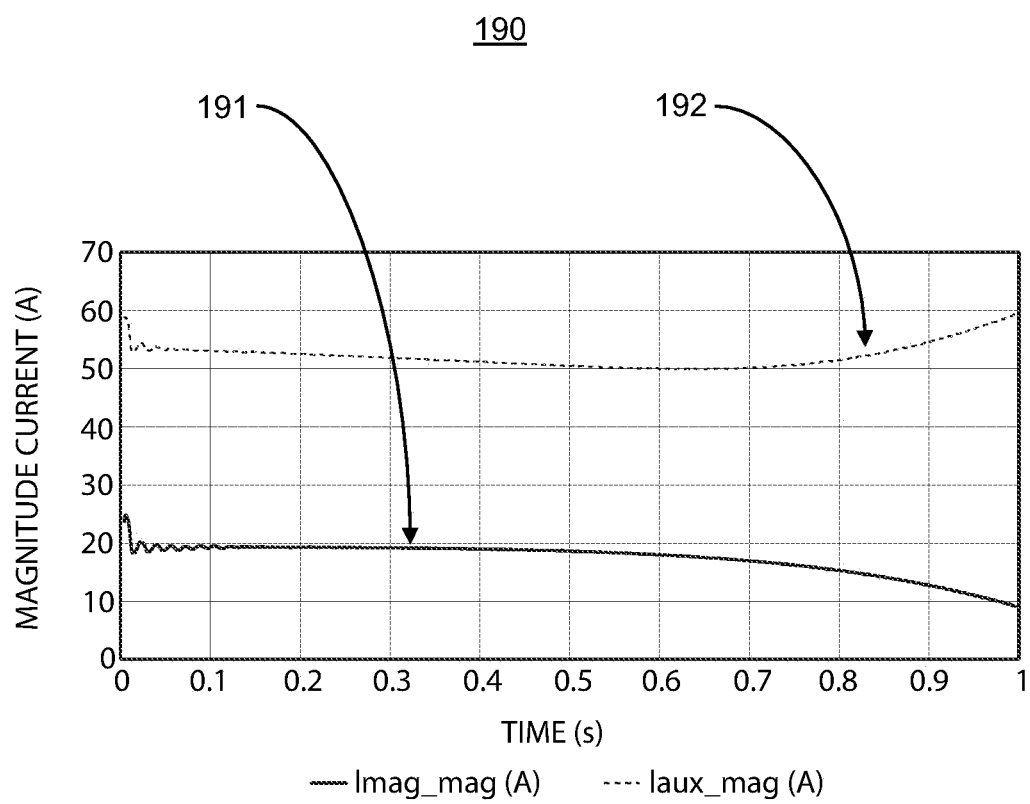
FIG. 15 illustrates exemplary FEA simulation results showing the main and auxiliary winding phase magnitude current curves at speeds ranging from 0 to 1,800 RPM over the first second of starting time.

The main winding phase magnitude current $I_M$ and auxiliary winding phase magnitude current $I_A$ can be calculated using Equation 14. FIG. 15 illustrates exemplary simulation results 190 showing the main winding magnitude current 191 and the auxiliary winding magnitude current 192 in comparison with the AC current waveforms 201, 202 in FIG. 16A. The magnitude curves represent the envelope curves of AC current waveforms.

V. Forward Magnitude Current for Speed Detection

Figure 17:
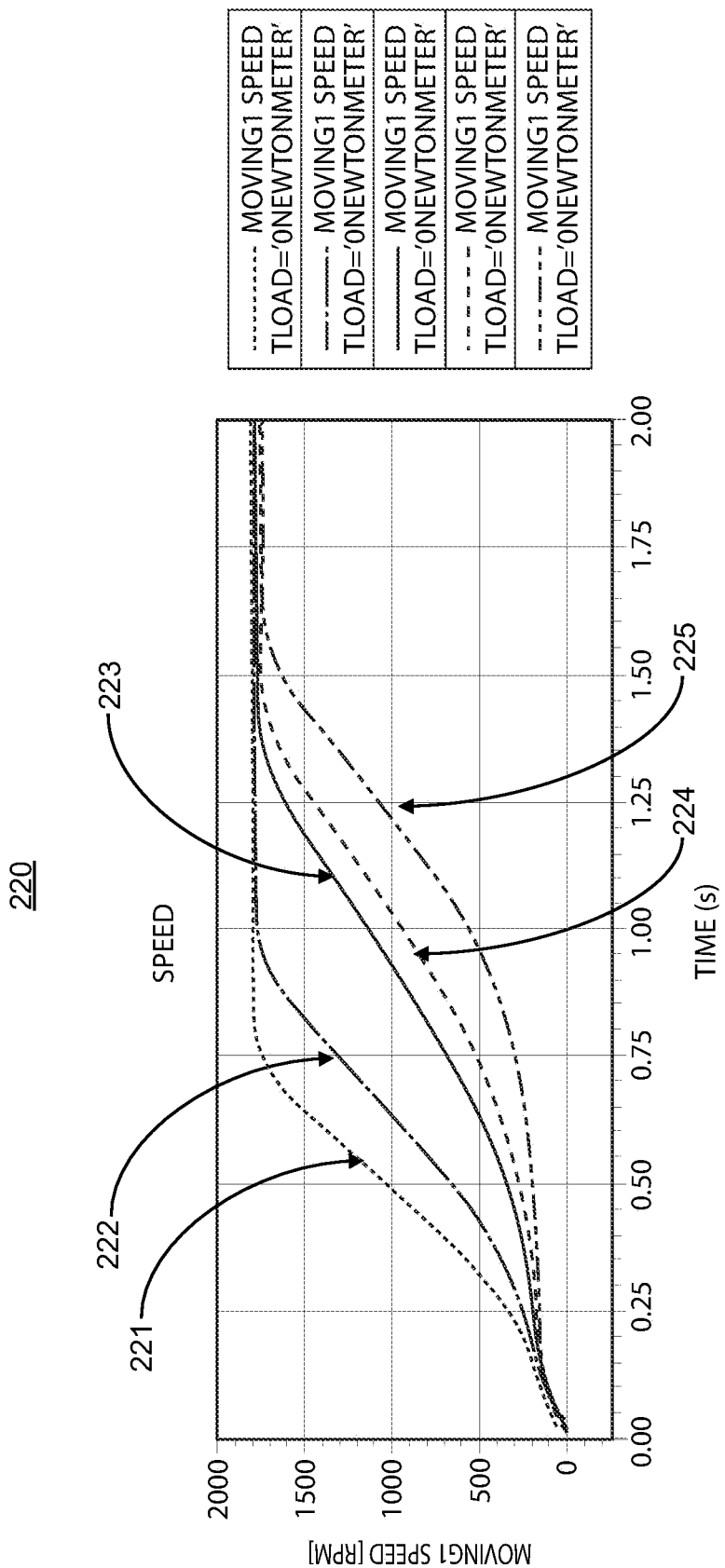
FIG. 17 illustrates testing and simulation results showing split-phase induction motor rotor starting speed ramp-up curves versus time under different loads.

The characteristics of a split-phase induction motor with a centrifugal switch, as used in household dryers loaded with a variety of wet cloth loads, were analyzed. FIG. 17 shows exemplary testing and simulation results depicting speed versus time curves during the starting process under different load conditions. Each curve illustrates a different wet clothes load condition: no load 221, quarter load 222, half load 223, three-quarter load 224 and full load 225. As depicted by the curves, the length of the starting period from zero up to the rated speed (in this case about 1,800 RPM) depends on the load sizes. In general, as the load is increased from no load 221 to full load 225, the actual starting time increases significantly (e.g., from about 0.75 seconds to over 1.5 seconds). These differences highlight the issues associated with starting methodologies based on timing alone; they are not suitable for household dryer split-phase motor starting controls.

Figures 18A, 18B:
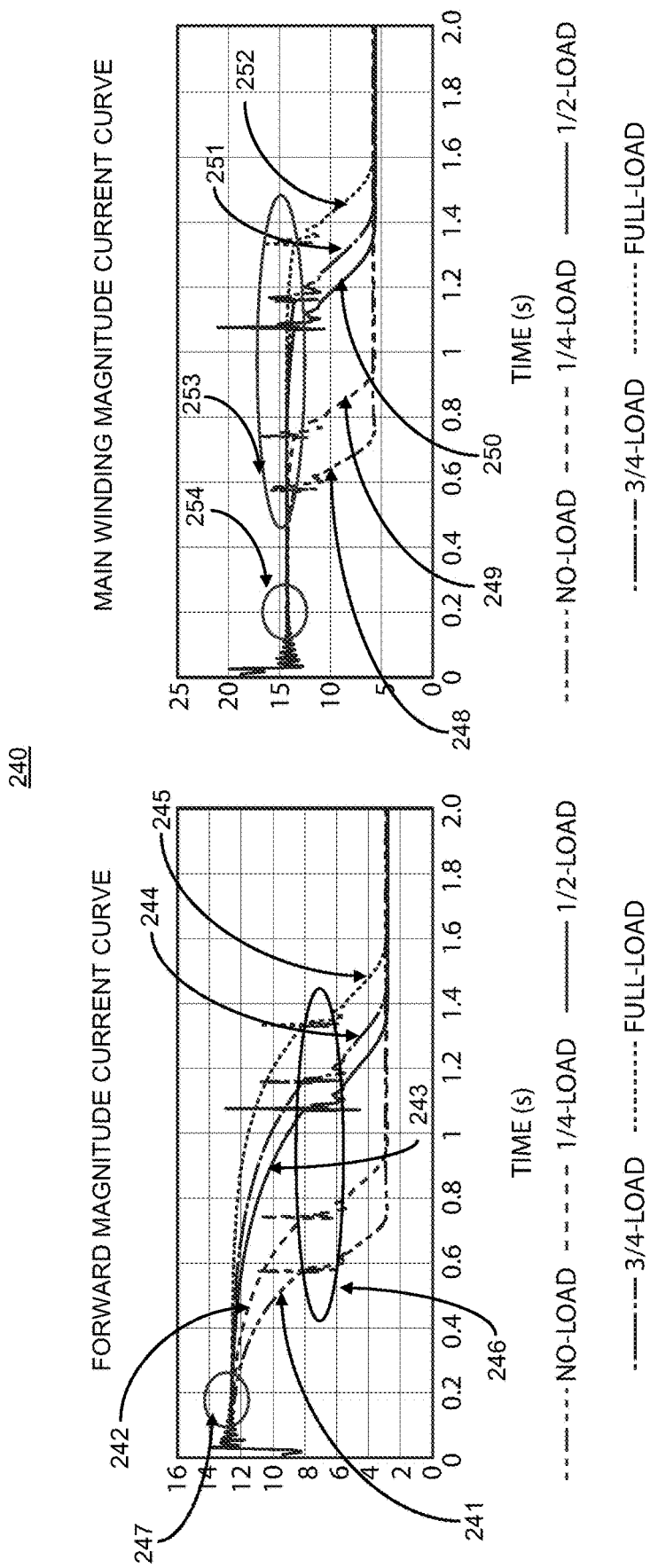
FIG. 18A illustrates testing and simulation results showing split-phase induction motor starting forward magnitude current curves versus time under different loads.
FIG. 18B illustrates testing and simulation results showing split-phase induction motor starting main winding magnitude current curves versus time under different loads.

The split-phase motor starting speed detection method is further explored by investigating the current characteristics in the synchronous speed d-q axis frame under different load conditions. FIG. 18A illustrates exemplary testing and simulation results showing the forward magnitude current curves during starting process under different load conditions from no load 241 to the full load 245. When the mechanical centrifugal switch disconnects the auxiliary winding at 75-80 percent of synchronous speed (referred to as a crossover speed point), the starting characteristic curves exhibit distorted current peaks at an identical or similar current value 246, which differ significantly from the starting moment current value 247. This occurs despite varying starting times due to different load conditions. Therefore, the forward magnitude current Imo can be a helpful indicator for detecting rotor speed.

FIG. 18B illustrates exemplary testing and simulation results showing the main winding magnitude current curves during the starting process under different load conditions from no load 248 to the full load 252. When the mechanical centrifugal switch disconnects the auxiliary winding at the crossover point speed, the starting characteristic curves exhibit distorted current peaks at an identical or close current value 253. However, this does not have a significant difference in comparison with the starting moment current value 254, with different starting times due to the load conditions. Therefore, the main winding magnitude current provides limited information for rotor starting speed detection.

Figure 19A:
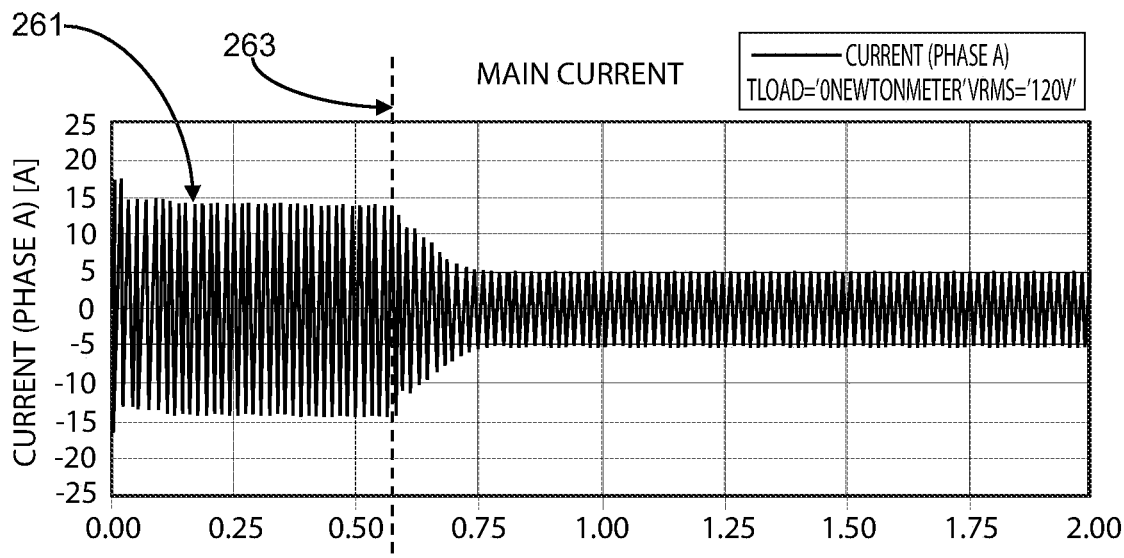
FIG. 19A illustrates testing and simulation results showing split-phase induction motor starting main winding current waveform versus time under no load.
Figure 19B:
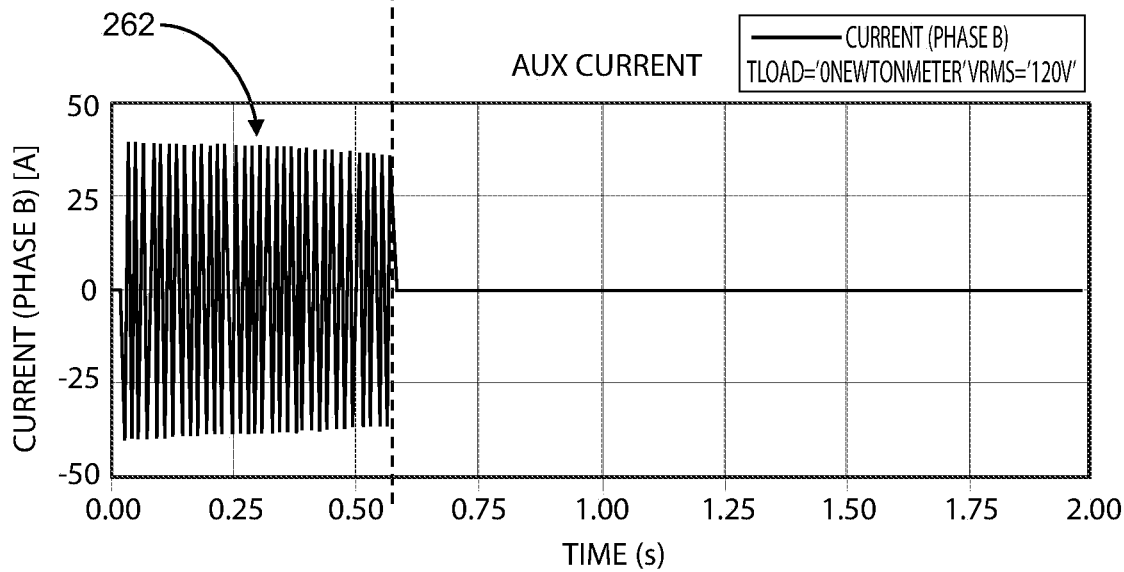
FIG. 19B illustrates testing and simulation results showing the split-phase induction motor starting auxiliary winding current waveform versus time under no load.

Additionally, FIGS. 19A-B illustrate exemplary testing and simulation results showing the main winding current waveform 261 and auxiliary winding current waveform 262 during the starting process under no load conditions, highlighting the crossover speed point moment 263. As shown in FIG. 19A, the change in the main winding current waveform from the starting moment to the crossover speed point is somewhat small, which also can be observed in the main winding magnitude current 248 in FIG. 18B. This is because, as the speed increases, the forward magnitude current reduced meanwhile the backward magnitude current increases, which results in an overall minor change of the main winding phase magnitude during the starting process. However, the corresponding forward magnitude current curve 241 in FIG. 18A of the main winding magnitude current 261 in FIG. 19A demonstrates a large change during the starting period. Therefore, the forward magnitude current can provide a robust signal for a rotor starting speed detection algorithm.

VI. Starting Speed Crossover Point Detection

As mentioned previously and referenced in FIGS. 17 and 18A-B, exemplary embodiments of starting speed crossover point speed detection method include sensing and responding to the forward magnitude current curve during starting process.

By calculating the ratio of the forward magnitude current 246 at the moment when the auxiliary winding is disconnected over the starting current 247 at the starting moment when the power is first supplied for different loads in FIG. 18A, load-relative coefficients $C_{im}$(Crossover) can be defined to quantify the ratios, as expressed in Equation 15. Further, these load-relative coefficients can remain relatively consistent across different load conditions and thus define a persistent coefficient $C_{im}$(Crossover).

In one exemplary embodiment, a persistent crossover coefficient of 0.65 was calculated. This indicates that when the real-time forward magnitude current reduces to 65% of the current at the starting moment, the speed has reached 65% of the synchronous speed, which is the detected crossover point speed. Based on the synchronous speed d-q axis frame system, this forward magnitude current ratio can be defined as a starting forward magnitude current coefficient that is expressed as, $$C_{im}(\text{Crossover}) = I_{m0}(\text{Crossover})/I_{m0}(\text{Starting}) \quad (15)$$

Where,
$C_{im}$(Crossover): the forward magnitude current coefficient at the crossover speed point,
$I_{m0}$(Starting): the stabilized forward magnitude current at starting moment,
$I_{m0}$(Crossover): the stabilized forward magnitude current at the crossover speed point.

To develop a robust crossover point speed detection algorithm, household dryer working conditions can be investigated. That is, by collecting more information about household dryer working conditions the effectiveness and robustness of a particular crossover point speed detection algorithm can be formed, evaluated, updated, and verified.

Figures 20A, 20B:
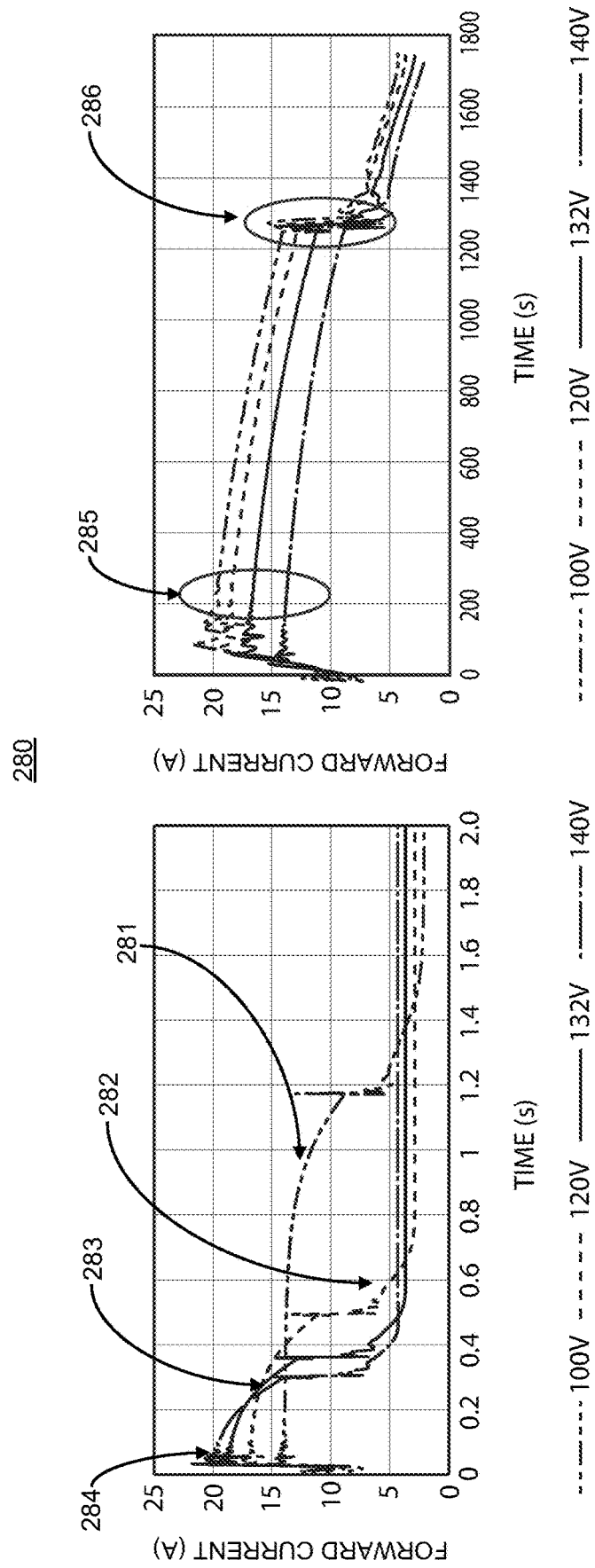
FIG. 20A illustrates testing and simulation results showing the split-phase induction motor starting forward magnitude current waveform versus time under different voltages at full load.
FIG. 20B illustrates testing and simulation results showing the split-phase induction motor starting forward magnitude current waveform versus speed under different voltages at full load.

Some of the working conditions that can influence the crossover point speed detection algorithm can include power line voltage variations. For example, the power line voltage can typically vary from 100V AC to 140V AC for household dryer applications. FIGS. 20A-B illustrate exemplary embodiments of testing and simulation results showing the forward magnitude current curve characteristics under different voltage supplies from 100 to 140V AC.

FIG. 20A depicts forward magnitude current curves versus timing under different voltage supplies, 100V AC 281, 120V AC 282, 132V AC 283 and 140V AC 284. These curves indicate significant changes in both timing discrepancies to switch and the current values, highlighting the impact of voltage variations on the overall system. That is, FIG. 20A shows how if an auxiliary winding switch were to operate based on a fixed timing (e.g., disconnect the auxiliary winding from the stator circuit 1 second after starting) there can potentially be issues such as insufficient torque to start the motor.

FIG. 20B illustrates the forward magnitude current curves versus speed under different power voltages, showing the consistency of the current ratios at the crossover point speed 286, which is about 70% of synchronous speed over the starting currents 285. By defining a crossover point to be $C_{im}$(Crossover)≅0.65, the auxiliary winding can be disconnected from the stator circuit just before the rotor reaches about 70% of synchronous speed. Together, FIGS. 20A-B demonstrate that power line voltage variations can have a significant effect on motor startup for starting processes that rely on fixed timing for auxiliary winding switching. Since the crossover speed point remains consistent when using forward magnitude current curves for a crossover speed point motor starting algorithm, the startup algorithm is not affected by power line voltage variations in the same way as a fixed timing motor starting algorithm.

That is, the forward magnitude current reduction trajectory curve relates to the actual starting speed acceleration and can be applied to detect the crossover point speed. By monitoring the real-time forward magnitude current $I_{m0}$(Open) and checking the reduction of the forward magnitude current, the crossover speed can be detected to start the motor, which can be expressed as, $$I_{m0}(\text{Open}) < C_{im}(\text{Crossover}) \cdot I_{m0}(\text{Starting}) \quad (16)$$

Where, $I_{m0}$(Open): real-time forward magnitude current during the starting process after auxiliary winding is powered on.

When the forward magnitude current $I_{m0}$(Open) is reduced to a value equal to or lower than the percentage of the starting current defined by the crossover point $C_{im}$(Crossover) (i.e., the rotor speed reaches the crossover point speed), the system disconnects the auxiliary winding. Based on the synchronous speed d-q frame system, the forward magnitude current trajectory curve is a continuous DC component of an electrical variable that is effective and robust for use in a split-phase induction motor starting algorithm executed by a controller of an electronic switch assembly.

The crossover point or ratio $C_{im}$(Crossover) can vary for different split-phase induction motors. For example, split-phase induction motors having different power ranges, components, and applications can have different crossover points. The crossover point can be determined specific to the individual split-phase induction motor by simulation, empirical experiment, or a combination thereof.

In some embodiments, sufficient information can be collected about a range of different domestic dryers and how they handle different loads such that a general and robust crossover point speed detection algorithm can be defined that is generally accurate for most, if not all, domestic dryers that utilize a split-phase induction motor. Alternatively, or in addition, a control system can be installed in each domestic dryer that provides a baseline crossover point speed detection algorithm. This algorithm can be adapted over time based on collected data during real-world use. In some embodiments, instead of providing a generic crossover point speed detection algorithm that can work generally for different dryer units, each type of dryer unit can be tuned based on experimental data collected during research and development or during the manufacturing process such that the baseline crossover point speed detection algorithm implemented in a domestic dryer's motor control system operates satisfactorily.

VII. Running Speed Closing Point Detection

A household dryer typically has a large drum driven by an electric motor, often a split-phase induction motor. The dryer drum holds a variety of wet fabric loads that absorb a certain amount of water. Frequently, an unexpected wet balling load may cause the speed of the drum, and therefore the speed of the motor rotor, to drop below the crossover point speed. To increase speed back to normal operational level, additional torque may be needed and therefore the starting algorithm process or portion thereof may be restarted to restore suitable torque for dryer operation. Specifically, an exemplary split-phase motor switch control algorithm can be defined where the auxiliary winding is disconnected when rotor speed is higher than 70 percent of synchronous speed, and connected when rotor speed is lower than 65 percent of synchronous speed. The crossover or switch open speed point and the switch closing speed point can be the same, or they may be offset slightly to reduce the amount of switching when the rotor speed is operating near the crossover speed point for an extended length of time. Essentially, whenever motor speed reduces to this closing speed point during the running operational period, the motor starting switch is turned-on to accelerate the motor rotor to above the crossover speed point to restore the single-phase operation at the rated speed.

A. Forward Magnitude Voltage, Current and Impedance in Single-Phase Operation

After starting, the dryer split-phase motor runs in a single-phase operational mode to drive a dryer drum. In this mode, only the main winding is powered on and carries a single-phase operational current, while the auxiliary winding is disconnected from the power. Despite the lack of auxiliary winding current, both the main and the auxiliary windings carry their respective induced voltages. By monitoring the motor characteristics of single-phase operation, a running, rather than starting, speed detection method can be implemented. This method can reengage the auxiliary winding at a defined closing speed point, facilitating efficient and robust motor performance.

Understanding the main winding's single-phase operations throughout the entire starting and operational process can facilitate improvement of motor speed control algorithms. When the dryer motor is powered, the main winding initially receives 120V AC. The motor can begin in single-phase operation before the auxiliary winding is connected to start the rotor. Then, the auxiliary winding can be connected to power. Once the auxiliary winding is connected, the motor operates in two-phase mode until it reaches the crossover speed point, at which point the switch associated with the auxiliary winding turns off, disconnecting the auxiliary winding. Upon disconnection from the power, the motor reverts to single-phase operation to accelerate the rotor to the rated speed, and then keeps driving the motor to keep the drum rotating until an overload condition is detected or the dryer cycle is complete. The characteristics of the main winding single-phase operation can facilitate motor running speed detection methods.

Referencing the frame systems defined in FIG. 11, applying the Park transformation into a two-phase system, Phase-A, 142 and Phase-B, 144 voltages in the frame a-b axis are transformed into the synchronous speed frame d-q axis voltages by, $$\begin{bmatrix} V_d \\ V_q \end{bmatrix} = \begin{bmatrix} \cos(\theta) & \sin(\theta) \\ -\sin(\theta) & \cos(\theta) \end{bmatrix} \begin{bmatrix} V_a \\ V_b \end{bmatrix} \quad (17)$$

Where,
$V_d$: d-axis voltage in the frame d-q axis,
$V_q$: q-axis voltage in the frame d-q axis,
$V_a$: Phase-A winding voltage in the static frame a-b axis,
$V_b$: Phase-B winding voltage in the static frame a-b axis.

The two-phase voltages of Phase A and Phase-B can be expressed in the frame a-b axis as, $$\begin{cases} V_a(t) = V_M(t) \\ V_b(t) = -V_A(t)/k_{AM} \end{cases} \quad (18)$$

Where,
$V_M$: main winding phase voltage, as shown in FIG. 8 102,
$V_A$: auxiliary winding phase voltage, as shown in FIG. 8 103.

Based on the equations, Eq.5 to Eq.8, to calculate the forward magnitude current previously, and applying the same process, the forward voltages can be calculated as follows, $$\begin{cases} v_{d0} = \dfrac{1}{T_2}[\text{int}(V_d, t) - \text{int}(V_d, t - T_2)] \\ v_{q0} = \dfrac{1}{T_2}[\text{int}(V_q, t) - \text{int}(V_q, t - T_2)] \end{cases} \quad (19)$$

$$V_{m0} = \sqrt{V_{d0}^2 + V_{q0}^2} \quad (20)$$

Where,
$V_{d0}$: the forward d-axis voltage in the synchronous speed frame d-q axis,
$V_{q0}$: the forward q-axis voltage in the synchronous speed frame d-q axis,
$V_{m0}$: the forward magnitude voltage in the synchronous speed frame d-q axis.

Regarding the forward magnitude current in single-phase operation, the forward magnitude current in two-phase operation was previously described. Single-phase operation is a specific case of two-phase operation, as represented by Equations 1 to 4, where the auxiliary winding phase current is zero, $i_b=0$, that is expressed as.

$$\begin{bmatrix} i_d \\ i_q \end{bmatrix} = \begin{bmatrix} \cos(\theta) & \sin(\theta) \\ -\sin(\theta) & \cos(\theta) \end{bmatrix} \begin{bmatrix} i_a \\ 0 \end{bmatrix} = \begin{bmatrix} i_a \cdot \cos(\theta) \\ -i_a \cdot \sin(\theta) \end{bmatrix} \quad (21)$$

By applying auxiliary winding current $i_b=0$, the forward magnitude current can be calculated using Equations 5 to 8. Therefore, the forward magnitude current, whether during single-phase or two-phase operation, can be calculated and monitored throughout the entire starting process from the moment the main winding is powered on.

Since the power voltage supply can vary, the concept of forward impedance is introduced to describe the motor characteristics while accounting for impacts of variable source voltages. Based on the forward magnitude voltage and current (i.e., while the auxiliary winding is disconnected), the forward impedance can be expressed as, $$Z_{m0}(t) = V_{m0}(t)/I_{m0}(t) \quad (22)$$

Where,
$Z_{mo}$: the forward impedance in single-phase operation.

Figures 21A, 21B:
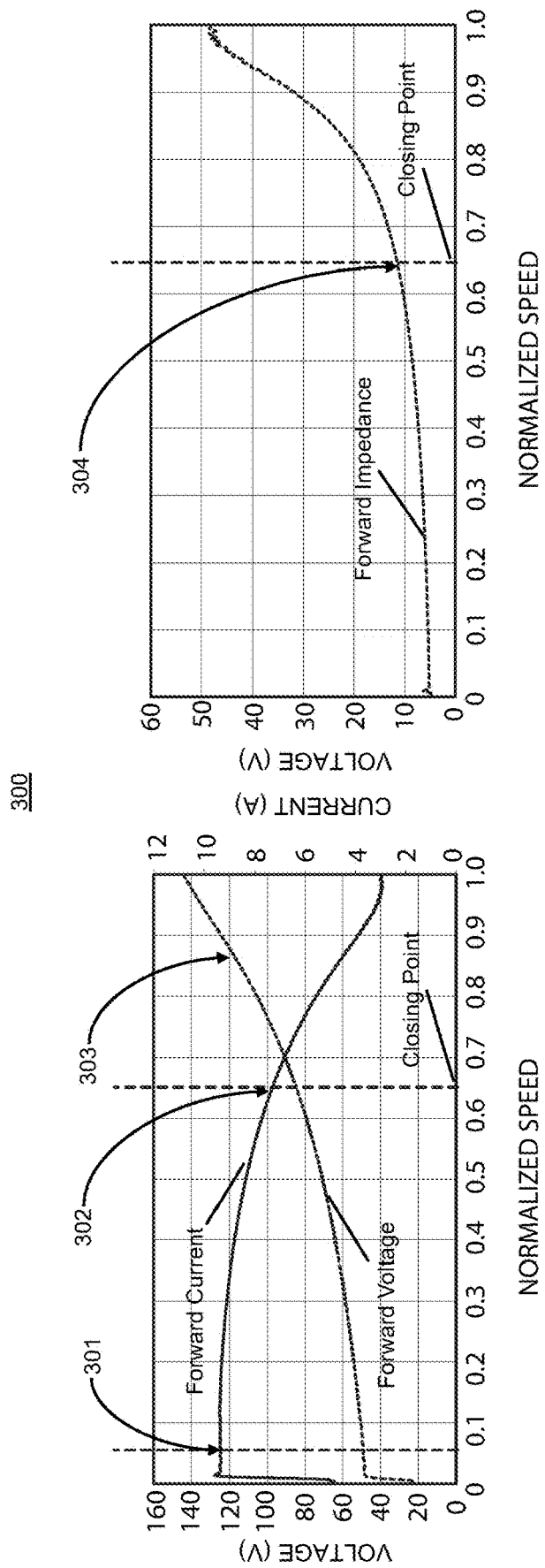
FIG. 21A illustrates testing and simulation results showing the split-phase induction motor starting forward magnitude current and voltage curves versus the normalized speed at full load.
FIG. 21B illustrates testing and simulation results showing the split-phase induction motor starting forward impedance curve versus the normalized speed at full load.

FIGS. 21A-B illustrate exemplary embodiments of testing and simulation results, showing the magnitudes of forward voltage 303, forward current 301, 302 and forward impedance 304 versus the normalized speed from low speed to the rated working speed. The forward magnitude voltage, forward magnitude current and the forward impedance change significantly as the speed increases from low speed to high and vice versa. Therefore, the forward magnitude voltage, current, and impedance are the motor characteristic variables that can impact a detection method of the actual running speed in real-time during normal single-phase operation.

B. Running Speed "Closing" Detection Method

To detect the running closing speed point, two variables can be utilized. The first variable leverages the characteristic of the forward magnitude current versus speed, as described previously in connection with FIG. 21A. The forward magnitude current coefficient, denoted as $C_{im}$(Crossover), in Equation 15, can be used to detect the crossover point. This crossover point detection method can also be applied to determine the running closing speed point. The closing forward magnitude current coefficient during single-phase operation, denoted as $C_{im}$(Closing), is defined as the current ratio of the forward magnitude current at the closing point to that at the pre-start point. This ratio is determined when only the main winding is powered on, as shown in FIG. 21A, 301 and is expressed as, $$C_{im}(\text{Closing}) = \sqrt{I_{m0}(\text{Closing})/I_{m0}(\text{Pre-start})} \quad (23)$$

Where,
$C_{im}$(Closing): the forward magnitude current coefficient at "Closing" point in single-phase operation,
$I_{m0}$(Closing): the forward magnitude current at "Closing" point, seeing FIG. 21A, 302 in single-phase operation,
$I_{m0}$(Pre-start): the forward magnitude current at "Pre-start" point, seeing FIG. 21A, 301 in single-phase operation.

The second variable involves the characteristic of the forward impedance versus speed 304, as shown in FIG. 21B. This characteristic exhibits a regular increase as the speed increases, which provides an additional control checking condition to stabilize the detection of the running closing speed point.

Therefore, during normal working speed with loads, due to the speed reduction under heavy load condition, the running closing speed point detection method can be used to reconnect the auxiliary winding to accelerate motor speed back to the rated speed. This method can be summarized as follows, (1) Based on the forward magnitude current coefficient for closing, $C_{im}$(Closing), monitoring the forward magnitude current, if the running forward magnitude current is larger than the closing point forward magnitude current (i.e., the forward magnitude current coefficient for closing multiplied by the pre-start current), $$I_{m0}(\text{Running}) > C_{im}(\text{Closing}) \cdot I_{m0}(\text{Pre-start}) \quad (24)$$

Where, $I_{m0}$(Running): the real-time running forward magnitude current at the single-phase operational running speed.

(2) Based on the forward impedance at the closing point, $Z_{m0}$(Closing), when condition (1) occurs, checking or monitoring the forward impedance, and if the real-time forward impedance at single-phase $Z_{m0}$(Running) is equal or less to $Z_{m0}$(Closing), 304. For example, as shown in FIG. 21B, where the forward impedance is 11.6 Ohm at the closing speed point.

$$Z_{m0}(\text{Running}) \leq Z_{m0}(\text{Closing}) \qquad (25)$$

Where, $Z_{m0}$(Running): the real-time running forward impedance at the single-phase operational running speed, $Z_{m0}$(Closing): the pre-determined forward impedance at the closing speed in the single-phase operation mode.

If both the conditions occur, the motor speed can be confirmed to have reached a predetermined percentage of synchronous speed (e.g., 65% of synchronous speed, which is the closing speed point in this example), and the auxiliary winding can be connected to accelerate the rotor back to the rate operational speed.

Both the forward magnitude current curve 301, 302 in FIG. 21A, and forward impedance curve 304 in FIG. 21B demonstrate exemplary characteristics of the split-phase motor during the starting and operational status periods and can be calculated ahead of time by simulation or experiment. The forward impedance concept introduction and application can effectively reduce the working condition variations, such as, source voltage variation. The detection method with the two criteria mentioned above are effective and robust to household dryer split-phase motor applications.

The ratios $C_{im}$(Closing) and $Z_{m0}$(Closing) can differ for a variety of split-phase motors based on the power range and applications. To effectively determine these ratios, empirical experiments can be run for individual split-phase motors or classes of split-phase motors.

This two-parameter running speed closing point detection algorithm provides robust and reliable indication that the rotor speed has gone below the crossover speed point. However, the present disclosure is not so limited, other embodiments and variations on this detection methodology are suitable. In one embodiment, the order of detection is varied, e.g., the forward impedance is actively monitored until it reaches the closing impedance and a secondary condition of the forward magnitude current reaching the closing point (closing coefficient multiplied by the stabilized pre-start current before the auxiliary winding is connected) is checked in response to confirm the running speed closing point has been detected. As another example, in some embodiments, monitoring the forward impedance alone is sufficient to trigger a confident detection of running speed closing point detection. Alternatively, in some embodiments, comparison of the forward magnitude current to a threshold (e.g., a threshold calculated based on a closing coefficient and stabilized pre-start forward magnitude current) alone may be sufficient to trigger running speed crossover detection.

VIII. Electronic Starting Switch Control Method and Implementation

According to methods for detecting rotor speed of the present disclosure that use forward magnitude current and impedance, exemplary embodiments of variable calculations and the control algorithms can include, but are not limited to, the forward magnitude current, voltage, and forward impedance during the starting process as well as normal operation to detect overload condition for restoring the rated speed.

Figure 22:
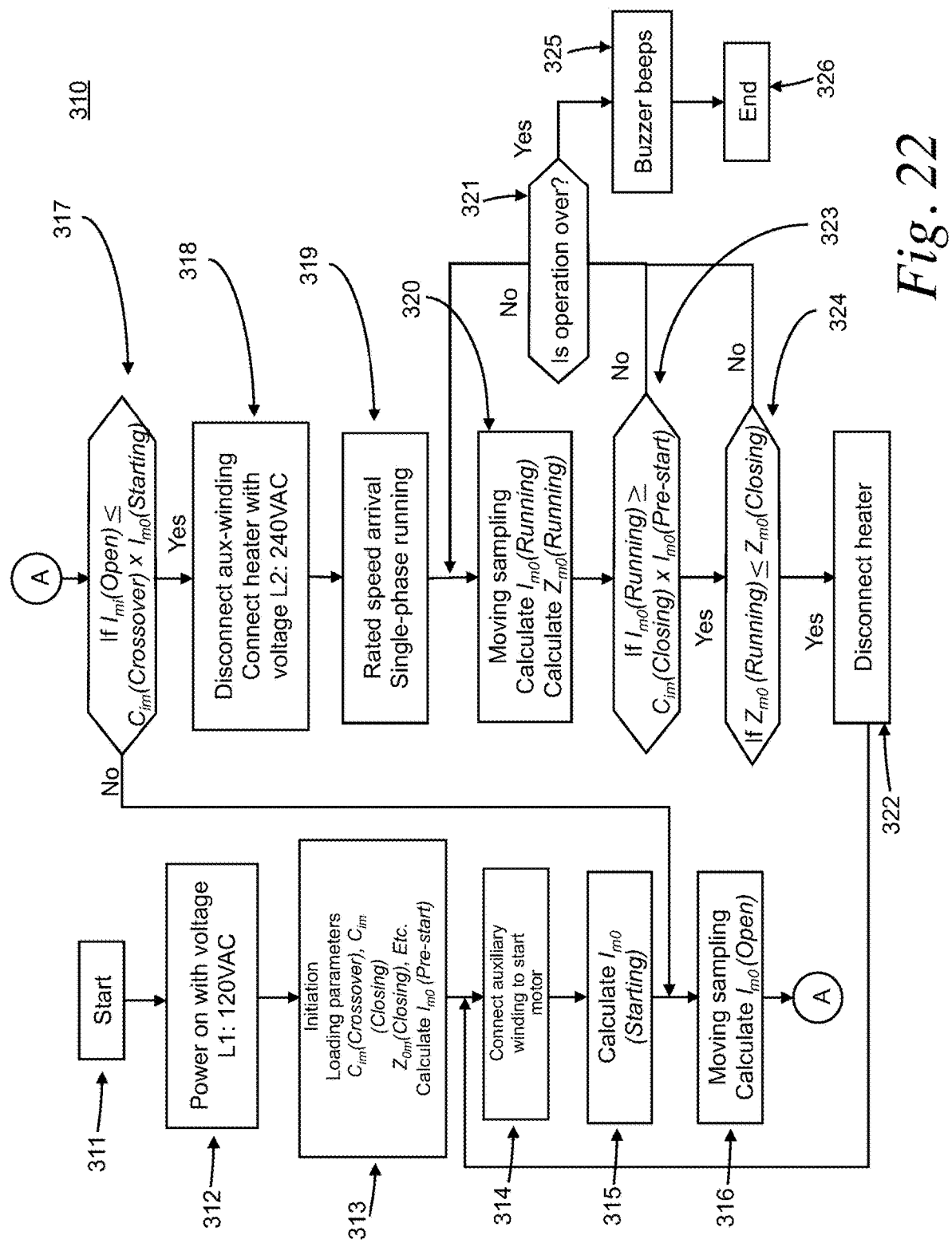
FIG. 22 illustrates a household dryer electronic switch module control algorithm logic flow chart.

FIG. 22 illustrates an exemplary embodiment of a functional control logic flow chart showing how the electronic starting switch assembly executes a control method of the present disclosure to operate a household dryer.

After the start 311, the motor is powered with 120V AC 312. The electronic starting control assembly, using a microcontroller unit (MCU), initiates the starting process to load all the parameters including sampling times and current and voltage ratios based on $C_{im}$(Crossover), $C_{im}$(Closing), and $Z_{0m}$(Closing). These ratios can be pre-acquired through simulations and experimental tests and recorded in the MCU 444 memory.

Before the auxiliary winding is powered on, the forward magnitude current $I_{m0}$(Pre-start) at single-phase operation is calculated and stored in memory for use during overload protection sensing 313. Once the auxiliary winding is connected to the power to start ramping the motor speed 314, the forward magnitude current $I_{m0}$(Starting) is calculated 315 as a reference to determine the crossover point speed. In some embodiments, a moving sampling window is maintained to calculate the real-time forward magnitude current $I_{m0}$(Open) reduction rate 316 until the condition defined by Equation 16 is achieved 317. At this moment, the auxiliary winding is disconnected, and the heater is connected to the high voltage power L2, 240 V AC, 318. The motor then enters single-phase operational mode 319 to drive the rotor to reach the rated stable speed. Meanwhile, a moving sampling window calculates the real-time forward magnitude voltage $V_{m0}$(Running), current $I_{m0}$(Running), and forward impedance $Z_{m0}$(Running) to monitor the rotor speed.

The motor remains the single-phase operation until the operating cycle is over or an overload condition is detected. If the first closing condition, expressed by Equation 24 occurs 323, then the second condition, expressed by Eq.25, is checked in 324 to determine whether the speed is below the closing speed point. If both the conditions are triggered, the speed is determined to be below the closing speed point and the controller responds accordingly. Specifically, in the current embodiment, the heater is disconnected from the power 322, meanwhile the auxiliary winding is reconnected to start ramping the motor rotor speed again 314. Otherwise, the motor keeps running without the auxiliary winding connected until the dryer operation is complete and the buzzer is switched on, signaling the end of the dryer cycle.

Figure 23A:
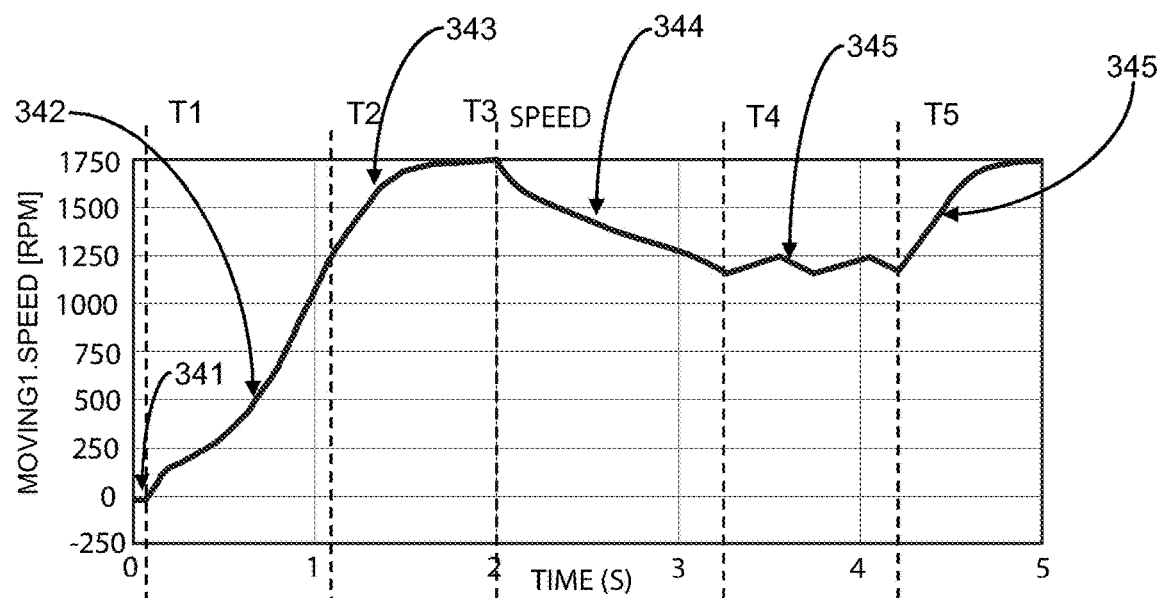
FIG. 23A illustrates testing and simulation results showing the split-phase induction motor starting and normal operational speed profile versus time at a load condition.
Figure 23B:
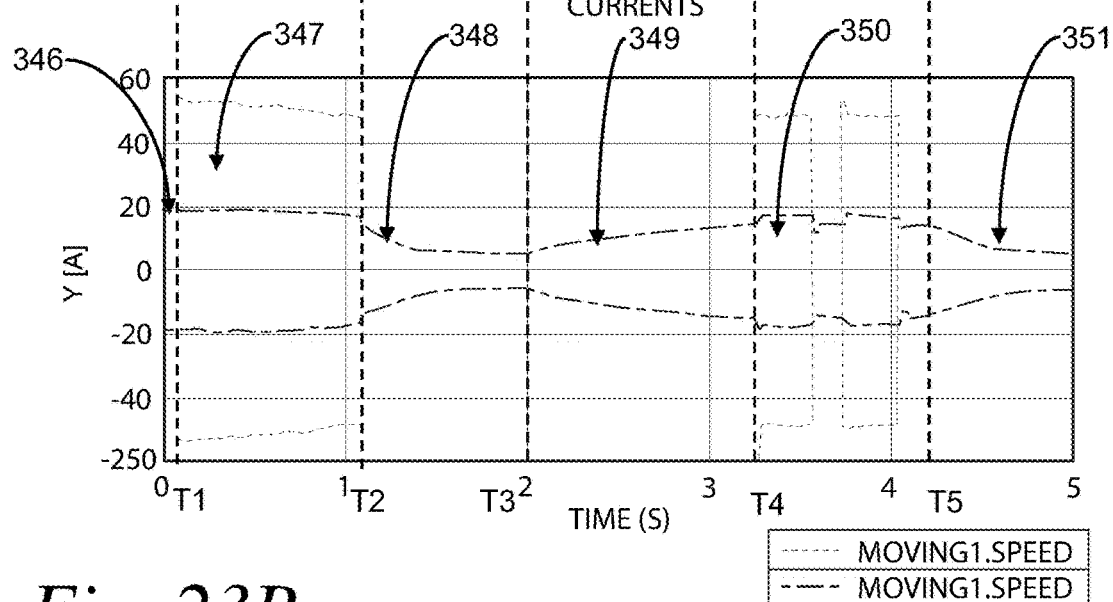
FIG. 23B illustrates testing and simulation results showing the split-phase induction motor main and auxiliary currents versus time at a load condition.

FIGS. 23A-B illustrate exemplary embodiments of the testing and simulation results, showing the speed as well as the main and auxiliary winding currents' characteristics versus time during starting and operational periods of a split-phase induction motor with an electronic starting switch assembly that is controlled by an improved dryer control algorithm of the present disclosure to operate a household dryer.

FIG. 23A illustrates a speed characteristic versus time during the starting and overload running periods to maintain normal operational speed with a load profile that simulates household dryer operation. Observing FIG. 23A, at the beginning, the motor's main winding is powered on, 341, for the pre-start period referenced as 313 in FIG. 22. Then, at time T1, both the main winding and auxiliary winding are powered to start under the load condition of a household dryer in operation 342. When the speed reaches the crossover point speed at time T2, the auxiliary winding is disconnected from the circuitry. Then, the motor enters single-phase operational mode 343 to accelerate the rotor up to the rated speed for normal dryer operation. In this example, at time T3, an overload appears momentarily as a pulse torque inside the dryer rotating drum, the motor starts to reduce speed 344 until the closing speed point at time T4. Then, the electronic switch assembly senses the speed dipping below the closing speed point and issues a command to reconnect the auxiliary winding back to the power to restart the motor again 345. Once the speed reaches or exceeds the crossover speed point, the auxiliary winding is disconnected again. During the period of time from T4 to T5, the rotor speed goes up and down between the closing speed point and crossover speed point. This speed up and down process can repeat multiple times due to the high load torque. However, in practical circumstances because the overload is caused by an imbalanced load inside rotating dryer drum, the number of times this sequence will repeat is generally short because the act of ramping the rotor speed up and down by inserting and removing the auxiliary winding from the circuit has a tendency to rebalance and settle the load. Further, the controller can respond to repeated fluctuations between the closing and crossover speed points by stopping the dryer cycle and using the buzzer or another indicator to bring the issue to the user's attention. At the time T5, the overload torque disappears, the motor speed accelerates to the rated speed and the motor returns back to normal single-phase operational mode to operate the household dryer until the dryer cycle completes.

FIG. 23B illustrates characteristics of the main and auxiliary winding currents versus time during the starting and overload running periods to maintain normal operational speed with a load profile that simulates a household dryer operation. Watching FIG. 23B of the phase currents, at the beginning, the motor's main winding is powered on, 346, for the pre-start period referenced as 313 in FIG. 22. Then, at time T1, both the main and auxiliary windings are powered to start the motor under a load condition of a household dryer in operation 347. When the speed reaches or exceeds the crossover speed point at time T2, the auxiliary winding is disconnected from the circuitry. Then, the motor enters the single-phase operational mode 343 to accelerate the rotor speed up to the rated speed for normal dryer operation 348 showing that the main winding phase current reduces and remains low during rated speed operation. At time T3, an overload condition appears momentarily as a pulse torque, and in response the motor starts to reduce speed 349 showing the main winding current increasing until the closing" speed point at time T4. Then, the electronic starting switch assembly senses the speed dipping below the closing point speed and reconnects the auxiliary winding back to the power to restart the motor again 350, showing the auxiliary winding phase current. When the speed reaches or exceeds the crossover speed point, the auxiliary winding is disconnected again, which repeats another time due to the high load torque. At time T5, the overload torque disappears, the motor speed accelerates to the rated speed back to normal single-phase operational mode to operate the household dryer.

Figure 24A:
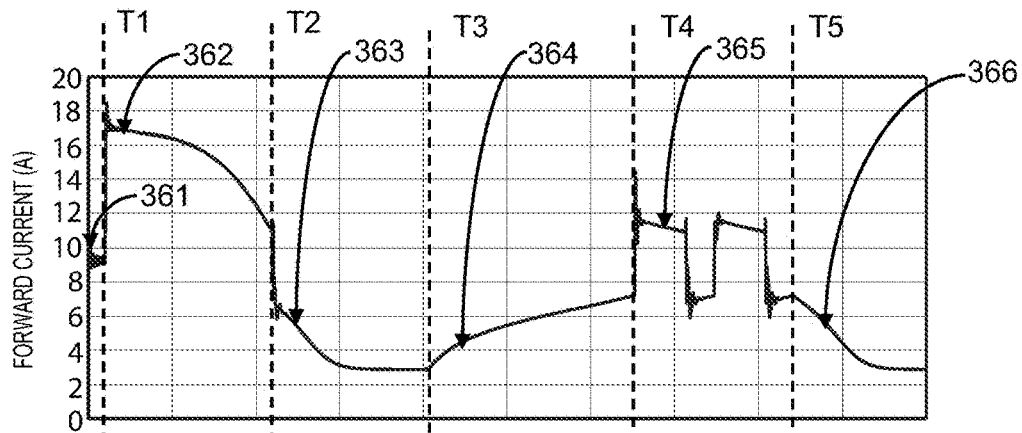
FIG. 24A illustrates testing and simulation results showing the split-phase induction motor forward magnitude current curve versus time at a load condition.
Figure 24B:
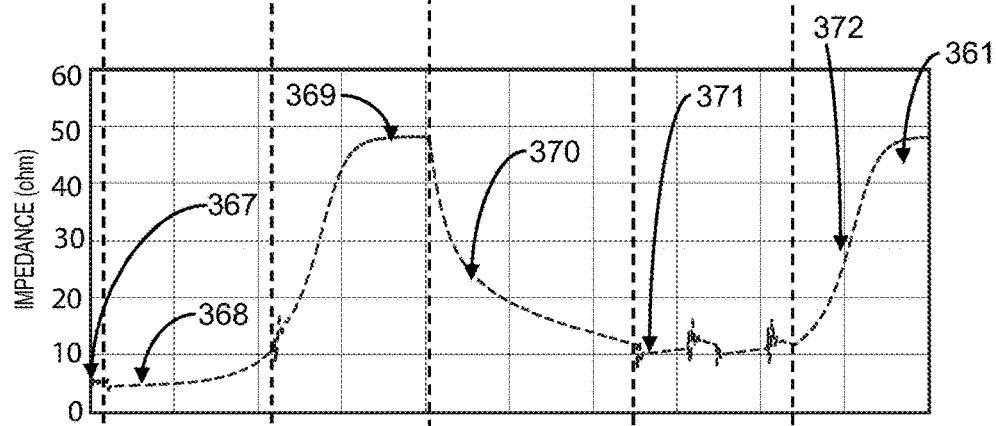
FIG. 24B illustrates testing and simulation results showing the split-phase induction motor forward impedance curve versus time at a load condition.
Figure 24C:
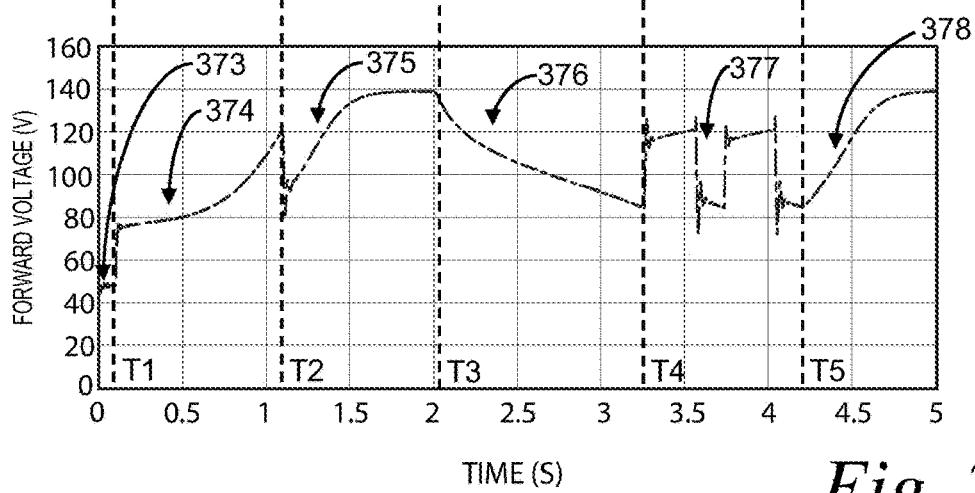
FIG. 24C illustrates testing and simulation results showing the split-phase induction motor forward magnitude voltage curve versus time at a load condition.

FIGS. 24A-C illustrate characteristics versus time of controllable variables, the forward magnitude current, forward magnitude voltage, and forward impedance during starting and operational periods of a split-phase motor with an electronic starting switch assembly configured to start and operate a split-phase induction motor of a household dryer. In this embodiment, these variables are calculated simultaneously in real-time during the entire household dryer operational period based on the synchronous speed frame d-q axis referenced in FIG. 11, as described previously.

FIGS. 24A-B illustrate the forward magnitude current and forward impedance characteristics versus time respectively during the starting and overload running periods to maintain normal operational speed with a load profile that simulates a household dryer operation. In FIG. 24A, at the beginning the motor main winding is powered on, 361, for the pre-start period referenced as 313 in FIG. 22. The forward magnitude current $I_{m0}$(Pre-start) is calculated. Then, at time T1, both the main and auxiliary windings are powered to start at a load condition of a household dryer in operation 362. The motor operates in two-phase mode, the $I_{m0}$(Starting) is calculated as a reference to detect the crossover speed point, after then the real-time forward magnitude current $I_{m0}$ (Open) reduces and is calculated to detect the crossover speed point. At time T2, the speed reaches the crossover speed point 317 in FIG. 22, and the auxiliary winding is disconnected from the circuitry. Then, the motor enters the single-phase operational mode 363 to accelerate the rotor speed up to the rated speed in normal dryer operation, the forward magnitude current reduces to the rated running current. At time T3, an overload appears momentarily as a pulse torque, the motor starts to reduce speed 344 in FIG. 23B, meanwhile the forward magnitude current in single-phase operation increases until the closing speed point is detected by applying the two conditions 364, 370 for overload detection at time T4. Then, the electronic switch assembly senses the speed dipping below the closing speed point and reconnects the auxiliary winding back to the power to restart the motor again 365, 371, the speed is over the crossover point speed, the auxiliary winding is disconnected again. This exemplary working circumstance of speed going up and down between 65 to 70 percent of synchronous speed may only repeat few times until the high load torque disappears inside the rotating drum. Then, at time T5, the overload torque disappears, and the motor speed accelerates to the rated speed back to normal single-phase operational mode to operate the household dryer.

FIG. 24C illustrates the forward magnitude voltage characteristic versus time during the starting and overload running period to maintain normal operational speed with a load profile that simulates a household dryer operation. The forward magnitude voltage is used for the calculation of the forward impedance.

Consequently, the electronic stating switch assembly control algorithms effectively detect the motor starting speed as well as the overload speed reduction in real-time to operate a household dyer. To verify the robustness, TABLE 1 represents exemplary embodiments of testing and simulation results of certain control variables to operate a household dryer split-phase induction motor under working conditions of different voltages.

TABLE 1

Testing and simulation results showing the electronic switch control algorithm's effectiveness and robustness under operational conditions of different voltages.

| | Operational Control Variables | | | | | | |
|---|---|---|---|---|---|---|---|
| Voltages | $I_{m0}$ (Starting) | $I_{m0}$ (Open) | $C_{im}$ (Crossover) | $I_{m0}$ (Pre-start) | $I_{m0}$ (Running) | $C_{im}$ (Closing) | $Z_{m0}$ (Closing) |
| 100 V | 14.0 A | 9.1 A | 0.65 | 7.8 A | 6.0 A | 0.77 | 11.6 Ohm |
| 120 V | 17.0 A | 11.0 A | 0.65 | 9.5 A | 7.3 A | 0.77 | 11.6 Ohm |
| 132 V | 19.0 A | 12.4 A | 0.65 | 10.5 A | 8.1 A | 0.77 | 11.6 Ohm |
| 140 V | 21.0 A | 13.7 A | 0.65 | 11.0 A | 8.4 A | 0.77 | 11.6 Ohm |

When the power supply voltage changes significantly, according to the specification from 100V AC to 140V AC range, even though all the forward magnitude currents vary accordingly, but also both the control coefficients, $C_{im}$ (Crossover) and $C_{im}$(Closing) as well as the forward impedance $Z_{m0}$(Closing) remain stable and relatively constant, that is 0.65, 0.77 and 11.6 Ohm respectively. Therefore, the electronic starting switch assembly and control algorithms described in this disclosure demonstrate effectiveness and robustness to operate a household dryer.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. An electronic starting switch assembly for controlling operation of a dryer having a heating element and having a split-phase induction motor having a main winding and an auxiliary winding wrapped around a stator for rotation of a rotor having a rotor speed, an induction motor power supply and a heater element power supply, the electronic starting switch assembly comprising:
   a microcontroller unit (MCU) configured to execute a control method for operating the dryer, including control of the split-phase induction motor of the dryer;
   a memory configured to store parameters for a crossover condition;
   sensing circuitry for sensing characteristics of the split-phase induction motor;
   power switch circuits configured to connect and disconnect the auxiliary winding of the split-phase induction motor and the heater element respectively to the induction motor power supply and the heater element power supply;
   wherein the MCU is configured to:
      load a crossover coefficient from memory;
      connect the auxiliary winding to the induction motor power supply to start ramping the rotor speed during a starting period of operation;
      real-time sample a main winding current and an auxiliary winding current to generate a real-time samplings of the main winding current and the auxiliary winding current;
      calculate stabilized startup forward magnitude current based on the main winding current and the auxiliary winding current;
      determine and store in memory a crossover condition based on the stabilized startup forward magnitude current and the crossover coefficient;
      monitor startup real-time forward magnitude current based on the real-time samplings of the main winding current and the auxiliary winding current during a startup period where the auxiliary winding is connected to the induction motor power supply;
      determine that the startup real-time forward magnitude current meets the crossover condition and in response 1) disconnect the auxiliary winding from the induction motor power supply; and 2) connect the heater element to the heater element power supply.

2. The electronic starting switch assembly of claim 1 wherein the MCU is configured to calculate, using a moving sampling window, a startup real-time forward magnitude current average.

3. The electronic starting switch assembly of claim 2 wherein the MCU is configured to determine the startup real-time forward magnitude current reaches the crossover condition by comparing the startup real-time forward magnitude current average to the crossover condition, wherein the crossover condition is a crossover speed point associated with the stabilized startup forward magnitude current and the crossover coefficient.

4. The electronic starting switch assembly of claim 1 wherein the MCU is configured to monitor startup real-time forward magnitude current by being configured to:
  define a phase-A frame represented by a main winding voltage and the main winding current;
  define a phase-B frame represented by an auxiliary winding voltage and the auxiliary winding current, wherein the phase-B frame is aligned in the opposite direction of the auxiliary winding, indicating that a phase-B axis lags the auxiliary winding by 180 electrical degrees;
  convert the main winding current to a phase-A current in the phase-A frame;
  convert the auxiliary winding current to a phase-B current in the phase-B frame;
  apply a Park transformation on the phase-A current and phase-B current to convert from a static AB frame to a synchronous speed frame d-q axis to provide d-q currents, wherein the d-q currents include one or more DC current components and one or more backward current components, wherein the one or more backward current components represent second-order harmonics;
  filter the d-q currents to remove the one or more backward current components providing the one or more DC current components ($i_{d0}$, $i_{q0}$); and
  obtain the startup real-time forward magnitude current from the one or more DC current components ($i_{d0}$, $i_{q0}$).

5. The electronic starting switch assembly of claim 1 wherein the MCU is configured to maintain single-phase operation until dryer operation is complete or an overload condition is detected.

6. The electronic starting switch assembly of claim 1 further comprising a memory configured to store one or more parameters associated with an overload condition, the overload condition being indicative of the rotor speed dropping below a closing speed point, wherein the MCU is configured to detect the overload condition.

7. The electronic starting switch assembly of claim 6 wherein the MCU is configured to:
  calculate a pre-start forward magnitude current before the MCU connects the auxiliary winding to the power supply to start ramping the rotor speed during the starting period of operation;
  load a closing coefficient from memory;
  determine and store in memory a running forward magnitude current closing speed point based on the pre-start forward magnitude current and the closing coefficient;
  monitor a running forward magnitude current during a running period of operation where the auxiliary winding is disconnected from the power supply;
  determine an overload condition exists based on a comparison of the running forward magnitude current and the running forward magnitude closing speed point and in response 1) disconnect the heater element from heater element power source; and 2) reconnect the auxiliary winding to the induction motor power source to ramp the rotor speed.

8. The electronic starting switch assembly of claim 7 wherein the MCU is configured to monitor the running forward magnitude current by being configured to:
  define a phase-A frame represented by a main winding voltage and the main winding current;
  define a phase-B frame represented by an auxiliary winding voltage and the auxiliary winding current, wherein the phase-B frame is aligned in the opposite direction of the auxiliary winding, indicating that a phase-B axis lags the auxiliary winding by 180 electrical degrees;
  convert the main winding current to a phase-A current in the phase-A frame;
  convert the auxiliary winding current to a phase-B current in the phase-B frame;
  apply a Park transformation on the phase-A current and phase-B current to convert from a static AB frame to a synchronous speed frame d-q axis to provide d-q currents, wherein the d-q currents include one or more DC current components and one or more backward current components, wherein the one or more backward current components represent second-order harmonics;
  filter the d-q currents to remove the one or more backward current components providing the one or more DC current components ($i_{d0}$, $i_{q0}$); and
  obtain the running forward magnitude current from the one or more DC current components ($i_{d0}$, $i_{q0}$).

9. The electronic starting switch assembly of claim 7 wherein the MCU is configured to:
  load a forward magnitude impedance closing point;
  determine a running forward magnitude impedance; and
  confirm the overload condition exists based on a comparison between a running forward magnitude impedance and the forward magnitude impedance closing point.

10. The electronic starting switch assembly of claim 6 wherein the MCU is configured to:
  load a predetermined closing forward impedance from memory;
  monitor a running forward magnitude impedance during a running period of operation where the auxiliary winding is disconnected from the power supply;
  determine that the running forward magnitude impedance reaches the predetermined closing forward impedance and in response and in response 1) disconnect the heater element from the heater element power supply; and 2) reconnect the auxiliary winding to the induction motor power supply to ramp the rotor speed.

11. The electronic starting switch assembly of claim 10 wherein the MCU is configured to monitor the running forward magnitude impedance by being configured to:
  define a phase-A frame represented by a main winding voltage and the main winding current;
  define a phase-B frame represented by an auxiliary winding voltage and the auxiliary winding current, wherein the phase-B frame is aligned in the opposite direction of the auxiliary winding, indicating that a phase-B axis lags the auxiliary winding by 180 electrical degrees;
  convert the main winding current to a phase-A current in the phase-A frame;
  convert the auxiliary winding current to a phase-B current in the phase-B frame;
  convert the main winding voltage to a phase-A voltage in the phase-A frame;
  convert the auxiliary winding voltage to a phase-B voltage in the phase-B frame;
  apply a Park transformation on the phase-A voltage and phase-B voltage to convert from a static AB frame to a synchronous speed frame d-q axis to provide d-q voltages, wherein the d-q voltages include DC voltage components and backward voltage components, wherein the backward voltage components represent second-order harmonics;
  apply a Park transformation on the phase-A current and phase-B current to convert from a static AB frame to a synchronous speed frame d-q axis to provide d-q currents, wherein the d-q currents include one or more DC current components and one or more backward current components, wherein the one or more backward current components represent second-order harmonics;

filter the d-q voltages to remove the backward voltage components providing the one or more DC voltage components ($V_{a0}$, $V_{q0}$);

filter the d-q currents to remove the backward voltage components providing the one or more DC current components ($i_{d0}$, $i_{q0}$);

obtain a running forward magnitude current from the one or more DC current components ($V_{a0}$, $V_{q0}$);

obtain a running forward magnitude voltage from the one or more DC voltage components ($V_{a0}$, $V_{q0}$); and obtain a running forward magnitude impedance ($Z_{m0}$) from the running forward magnitude current and the running forward magnitude voltage.

12. The electronic starting switch assembly of claim 1 including a housing configured to support a printed circuit board (PCB) and incorporating a heatsink.

13. The electronic starting switch assembly of claim 12 wherein the heat-sink includes wing grooves aligned with motor shaft axial direction to facilitate airflow generated by a fan on a rotor end ring for improved heat dissipation.

14. The electronic starting switch assembly of claim 13 wherein the housing dimensions are tailored to split-phase induction motor components, and additional side wings on the heatsink increase effective surface area for airflow.

15. The electronic starting switch assembly of claim 12, including a pool house formed above the PCB and within the housing, filled with a protective material to shield electronic components from environmental damage.

16. A method for controlling operation of a dryer having a split-phase induction motor having memory, a controller, a one or more power supplies, a main winding, an auxiliary winding, a heater element, and an electronic starting switch assembly, the method comprising:

loading a crossover coefficient from memory;

connecting the auxiliary winding to the one or more power supply to start ramping a rotor speed during a starting period of operation;

sensing a main winding current and an auxiliary winding current during the starting period of operation;

determining a stabilized startup forward magnitude current based on the main winding current and auxiliary winding current sensed at a beginning of the starting period of operation;

determining and storing in memory a crossover condition based on the stabilized startup forward magnitude current and the crossover coefficient;

determining a real-time startup forward magnitude current based on the main winding current and the auxiliary winding current sensed during the starting period of operation;

determining that the real-time startup forward magnitude current meets the crossover condition and in response 1) disconnecting the auxiliary winding from the one or more power supplies; and 2) connecting the heater element to the one or more power supplies.

17. The method for controlling operation of a dryer of claim 16 wherein determining the real-time startup forward magnitude current includes calculating a real-time startup forward magnitude current average using a moving sampling window of the main winding current and the auxiliary winding current during the starting period of operation.

18. The method for controlling operation of a dryer of claim 17 wherein determining that the real-time startup forward magnitude current meets the crossover condition including comparing the real-time startup forward magnitude current average to the crossover condition, wherein the crossover condition is a crossover speed point associated with the stabilized startup forward magnitude current and the crossover coefficient.

19. The method for controlling operation of a dryer of claim 16 including detecting an overload condition, the overload condition being indicative of the rotor speed dropping below a closing speed point.

20. The method for controlling operation of a dryer of claim 19 including:

calculating a pre-start forward magnitude current before connecting the auxiliary winding to the one or more power supplies to start ramping the rotor speed during the starting period of operation;

loading a closing coefficient from memory;

determining and storing in memory a running forward magnitude current closing speed point based on the pre-start forward magnitude current and the closing coefficient;

monitoring a running forward magnitude current during a running period of operation where the auxiliary winding is disconnected from the one or more power supplies;

determining an overload condition exists based on a comparison of the running forward magnitude current and the running forward magnitude closing speed point and in response 1) disconnecting the heater element from the one or more power supplies; and 2) reconnecting the auxiliary winding to the one or more power supplies to ramp the rotor speed.

21. The method for controlling operation of a dryer of claim 20 including:

loading a forward magnitude impedance closing point;

determining a running forward magnitude impedance; and confirming the overload condition exists based on a comparison between the running forward magnitude impedance and the forward magnitude impedance closing point.

22. The method for controlling operation of a dryer of claim 19 including loading a predetermined closing forward impedance from memory;

monitoring a running forward magnitude impedance during a running period of operation where the auxiliary winding is disconnected from the one or more power supplies; and determining that the running forward magnitude impedance reaches the predetermined closing forward impedance and in response and in response 1) disconnecting the heater element from the one or more power supplies; and 2) reconnecting the auxiliary winding to the one or more power supplies to ramp the rotor speed.

\* \* \* \* \*

UNITED STATES PATENT AND TRADEMARK OFFICE
CERTIFICATE OF CORRECTION

Page 1 of 1

PATENT NO. : 12,244,249 B1
APPLICATION NO. : 18/882156
DATED : March 4, 2025
INVENTOR(S) : Dingsheng Lin et al.

It is certified that error appears in the above-identified patent and that said Letters Patent is hereby corrected as shown below:

In the Claims

Column 33, Claim 16, Line 33:
"a one or more power supplies, a main winding, an auxiliary"
Should be:
--one or more power supplies, a main winding, an auxiliary--

Column 33, Claim 16, Line 38:
"power supply to start ramping a rotor speed during a"
Should be:
--power supplies to start ramping a rotor speed--

Signed and Sealed this
Sixth Day of May, 2025

Coke Morgan Stewart
*Acting Director of the United States Patent and Trademark Office*